US012727313B2

(12) United States Patent
Ikeda et al.

(10) Patent No.: US 12,727,313 B2
(45) Date of Patent: Sep. 1, 2026

(54) DISPLAY DEVICE

(71) Applicant: Japan Display Inc., Tokyo (JP)

(72) Inventors: Masanobu Ikeda, Tokyo (JP); Masumi Nishimura, Tokyo (JP); Masashi Tsubuku, Tokyo (JP)

(73) Assignee: Japan Display Inc., Tokyo (JP)

( * ) Notice: Subject to any disclaimer, the term of this patent is extended or adjusted under 35 U.S.C. 154(b) by 364 days.

(21) Appl. No.: 18/466,043

(22) Filed: Sep. 13, 2023

(65) Prior Publication Data

US 2023/0420485 A1 Dec. 28, 2023

Related U.S. Application Data

(63) Continuation of application No. PCT/JP2022/014565, filed on Mar. 25, 2022.

(30) Foreign Application Priority Data

Mar. 31, 2021 (JP) ................................ 2021-059367

(51) Int. Cl.
*H10H 29/14* (2025.01)
*H10D 86/40* (2025.01)
*H10D 86/60* (2025.01)

(52) U.S. Cl.
CPC ......... *H10H 29/142* (2025.01); *H10D 86/423* (2025.01); *H10D 86/60* (2025.01)

(58) Field of Classification Search
None
See application file for complete search history.

(56) References Cited

U.S. PATENT DOCUMENTS 8,791,474 B1 * 7/2014 Bibl ..................... G09G 3/2003 257/89
9,583,548 B2 * 2/2017 Park ..................... H10K 59/131
2009/0072243 A1 3/2009 Suda et al.
2011/0266565 A1 * 11/2011 Wang .................... G02F 1/1339 257/91
2013/0077034 A1 * 3/2013 Jung ..................... G02F 1/1345 349/122
2015/0187854 A1 * 7/2015 Beak .................. H10K 59/1216 438/23

(Continued)

FOREIGN PATENT DOCUMENTS

JP 2001102669 A 4/2001
JP 2010114112 A 5/2010

(Continued)

OTHER PUBLICATIONS

Office Action issued on Mar. 12, 2024, in corresponding Japanese Application No. 2023-511190, 6 pages.

(Continued)

*Primary Examiner* — Bilkis Jahan
(74) *Attorney, Agent, or Firm* — Maier & Maier, PLLC

(57) ABSTRACT

A display device includes an amorphous glass substrate, a first buffer layer on a first surface of the amorphous glass substrate, a transistor including a first gallium nitride layer over the first buffer layer, a second buffer layer on the first surface of the amorphous glass substrate, and a light emitting diode including a second gallium nitride layer over the second buffer layer. The transistor and the light emitting diode are electrically connected to each other.

14 Claims, 35 Drawing Sheets

(56) References Cited

U.S. PATENT DOCUMENTS

| | | | | |
|---|---|---|---|---|
| 2016/0268551 | A1* | 9/2016 | Shen | H10K 59/12 |
| 2017/0141180 | A1* | 5/2017 | Matsumoto | H10K 59/122 |
| 2018/0090700 | A1* | 3/2018 | Nishinohara | H10K 77/111 |
| 2018/0151120 | A1* | 5/2018 | Kim | H10K 59/1213 |
| 2020/0075664 | A1* | 3/2020 | Azize | H01S 5/0261 |
| 2020/0350184 | A1 | 11/2020 | Dasgupta et al. | |
| 2021/0026046 | A1* | 1/2021 | Shim | H04M 1/0266 |
| 2021/0343682 | A1* | 11/2021 | Hsiang | H10D 86/60 |
| 2022/0059518 | A1* | 2/2022 | Akimoto | G09F 9/30 |

FOREIGN PATENT DOCUMENTS

| | | | |
|---|---|---|---|
| JP | 201478575 | A | 5/2014 |
| WO | 2006114999 | A1 | 11/2006 |
| WO | 2020188851 | A1 | 9/2020 |

OTHER PUBLICATIONS

International Search Report mailed Jun. 7, 2022, in corresponding International Application No. PCT/JP2022/014565, 7 pages.

* cited by examiner

DISPLAY DEVICE

CROSS-REFERENCE TO RELATED APPLICATIONS

This application is a Continuation of International Patent Application No. PCT/JP2022/014565, filed on Mar. 25, 2022, which claims the benefit of priority to Japanese Patent Application No. 2021-059367, filed on Mar. 31, 2021, the entire contents of which are incorporated herein by reference.

FIELD

One embodiment of the present invention relates to a display device including a transistor and a light emitting diode using gallium nitride.

BACKGROUND

Gallium nitride (GaN) is characterized as a direct bandgap semiconductor with a large bandgap. This feature of gallium nitride is utilized, and a light emitting diode (LED) using gallium nitride has already been in practical use. Gallium nitride also has the characteristics of high electron saturation mobility and high breakdown voltage. In recent years, the characteristics of gallium nitride are utilized, and a transistor for a high-frequency power device has been developed. A gallium nitride film for a light emitting diode or a transistor is generally formed on a sapphire substrate at a high temperature of 800 degrees to 1000 degrees using MOCVD (Metal Organic Chemical Vapor Deposition) or HVPE (Hydride Vapor Phase Epitaxy).

In recent years, the development of a so-called micro LED display device or a mini-LED display device in which minute micro LEDs are mounted in pixels on a circuit substrate is proceeding as a next-generation display device. The micro LED display device or the mini LED display device has high efficiency, high brightness and high reliability. Such a micro LED display device or a mini-LED display device is manufactured by transferring a LED chip to a backplane on which a transistor using an oxide semiconductor or low-temperature polysilicon is formed (for example, see U.S. Pat. No. 8,791,474). Further, a method for forming a transistor and a light emitting diode including gallium nitride on the same substrate has been developed (for example, see U.S. Patent Application Publication No. 2020/0075664).

SUMMARY

A display device according to an embodiment of the present invention includes an amorphous glass substrate, a first buffer layer on a first surface of the amorphous glass substrate, a transistor including a first gallium nitride layer over the first buffer layer, a second buffer layer on the first surface of the amorphous glass substrate, and a light emitting diode including a second gallium nitride layer over the second buffer layer. The transistor and the light emitting diode are electrically connected to each other.

A display device according to an embodiment of the present invention includes a first amorphous glass substrate, a first buffer layer on the first amorphous glass substrate, a transistor including a first gallium nitride layer over the first buffer layer, a second amorphous grass substrate, a second buffer layer on the second amorphous glass substrate, a light emitting diode including a second gallium nitride layer over the second buffer layer, and a conductive connection member between the transistor and the light emitting diode. The transistor and the light emitting diode are electrically connected to each other through the conductive connection member.

BRIEF DESCRIPTION OF DRAWINGS

FIG. 3 is a cross-sectional view of a pixel of a display device according to an embodiment of the present invention.

FIG. 5C is a cross-sectional view showing a method for manufacturing a display device according to an embodiment of the present invention.

FIG. 8 is a cross-sectional view of a pixel of a display device according to an embodiment of the present invention.

FIG. 9 is a cross-sectional view of a pixel of a display device according to an embodiment of the present invention.

FIG. 20 is a cross-sectional view of a drive circuit portion of a display device according to an embodiment of the present invention.

DESCRIPTION OF EMBODIMENTS

Figure 1:
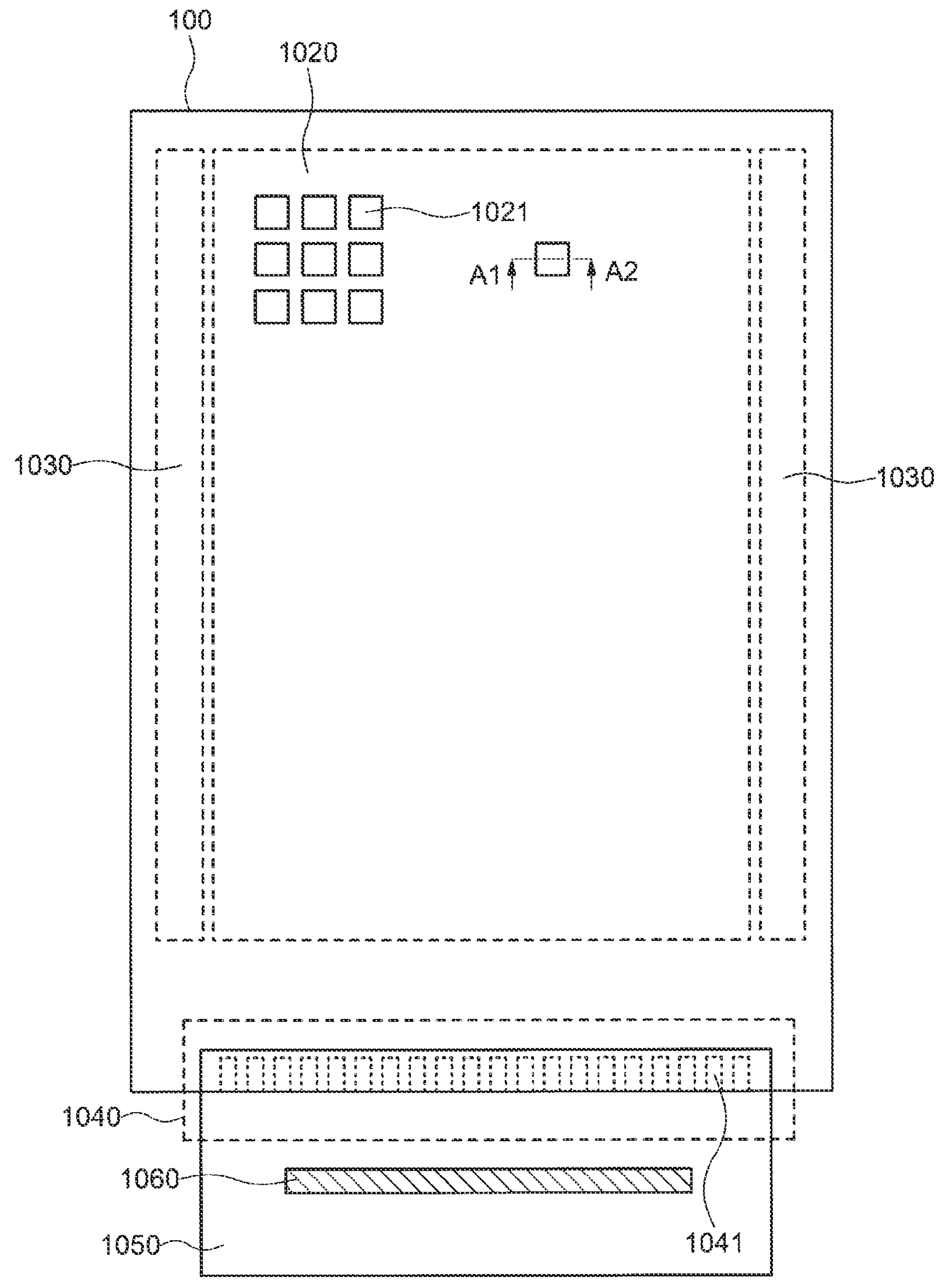
FIG. 1 is a schematic diagram showing a configuration of a display device according to an embodiment of the present invention.

The manufacturing method of the micro LED display device by transferring LED chips is high in manufacturing cost, and it is difficult to manufacture the micro LED display device at low cost. If a light emitting diode and a transistor using gallium nitride can be formed on a large-sized substrate such as an amorphous glass substrate, the manufacturing cost can be reduced. However, since the gallium nitride film is formed on the sapphire substrate at a high temperature as described above, it is difficult to form the transistor and the light emitting diode including gallium nitride directly on the amorphous glass substrate.

In view of the above problem, one object of an embodiment of the present invention is to provide a display device including a transistor and a light emitting diode using a gallium nitride layer formed over an amorphous glass substrate.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient terms used to distinguish each configuration, and have no further meaning unless otherwise explained.

In the specification and the drawings, the same reference numerals may be used when multiple configurations are identical or similar in general, and reference numerals with a lower or upper case letter of the alphabet may be used when the multiple configurations are distinguished. Further, reference numerals with a hyphen and a natural number may be used when multiple portions of one configuration are distinguished.

The following embodiments can be combined with each other as long as there is no technical contradiction.

First Embodiment

A display device 10 according to an embodiment of the present invention is described with reference to FIGS. 1 to 7C.

1. Overview of Configuration of Display Device 10

FIG. 1 is a schematic diagram showing a configuration of a display device according to an embodiment of the invention. In the display device 10, a display portion 1020, a drive circuit portion 1030, and a terminal portion 1040 are provided on a substrate 100. The driver circuit portion 1030 is provided around the display portion 1020 and can control the display portion 1020. For example, the drive circuit portion 1030 includes a scan drive circuit. Further, the terminal portion 1040 is provided at an end portion of the substrate 100 and can supply a signal or power to the display device 10. For example, the terminal portion 1040 includes terminals 1041. The terminals 1041 are connected to a flexible printed circuit substrate 1050. A driver IC 1060 may be provided on the flexible printed circuit substrate 1050.

The display portion 1020 can display an image or video, and includes a plurality of pixels 1021 arranged in a matrix. However, the arrangement of the plurality of pixels 1021 is not limited to a matrix. For example, the plurality of pixels 1021 can also be arranged in a zigzag pattern.

2. Configuration of Pixel 1021

Figure 2:
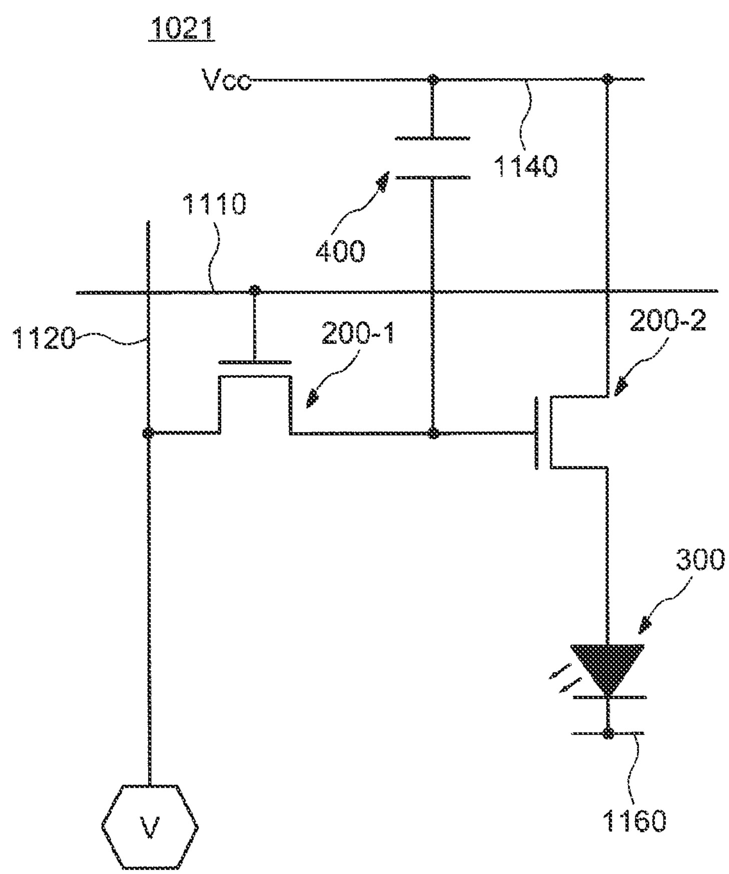
FIG. 2 is a circuit diagram (pixel circuit) of a pixel of a display device according to an embodiment of the present invention.

FIG. 2 is a circuit diagram (pixel circuit) of the pixel 1021 of the display device 10 according to an embodiment of the present invention. The pixel 1021 includes a first transistor 200-1, a second transistor 200-2, a light emitting diode 300, and a capacitive element 400.

The first transistor 200-1 can function as a select transistor. That is, the conduction state of the first transistor 200-1 is controlled by a scanning line 1110. A gate, a source, and a drain of the first transistor 200-1 are electrically connected to the scan line 1110, a signal line 1120, and a gate of the second transistor 200-2, respectively.

The second transistor 200-2 can function as a drive transistor. That is, the second transistor 200-2 controls a light emission brightness of the light emitting diode 300. The gate, a source, and a drain of the second transistor 200-2 are electrically connected to the source of the first transistor 200-1, a driving power supply line 1140, and an anode (p-type electrode) of the light emitting diode 300, respectively.

One of the capacitor electrodes of the capacitive element 400 is electrically connected to the gate of the second transistor 200-2 and the drain of the first transistor 200-1. Further, the other capacitive electrode of the capacitive element 400 is electrically connected to the driving power supply line 1140.

The anode of the light emitting diode 300 is connected to the drain of the second transistor 200-2. Further, a cathode (n-type electrode) of the light emitting diode 300 is connected to a reference power supply line 1160.

Although a layer configuration of the pixel 1021 is described with reference to FIG. 3 in the following description, the first transistor 200-1 and the second transistor 200-2 are described as a transistor 200 without any particular distinction.

Figure 3:
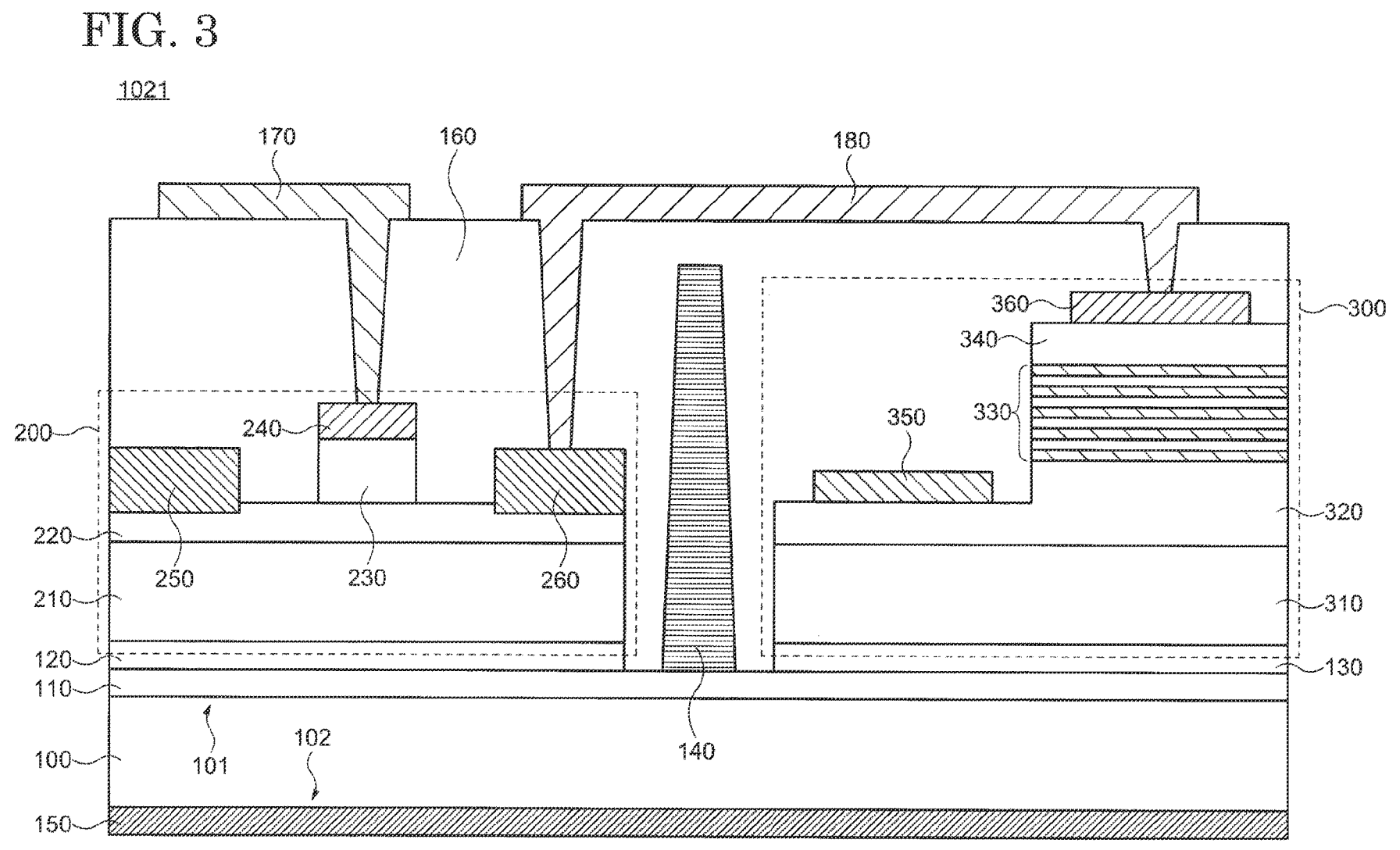

FIG. 3 is a cross-sectional view of the pixel 1021 of the display device 10 according to an embodiment of the present invention. Specifically, FIG. 3 is a cross-sectional view of the pixel 1021 taken along line A1-A2 shown in FIG. 1. As shown in FIG. 3, the display device 10 includes the substrate 100, a base layer 110, a first buffer layer 120, a transistor 200, a second buffer layer 130, the light emitting diode 300, a light shielding wall 140, a light shielding layer 150, an interlayer film 160, a conductive layer 170, and a transparent conductive layer 180. The base layer 110, the first buffer layer 120, the transistor 200, the second buffer layer 130, the light emitting diode 300, the light shielding wall 140, the interlayer film 160, the conductive layer 170, and the transparent conductive layer 180 are provided on the side of a first surface 101 of the substrate 100. Further, the light shielding layer 150 is provided on the side of a second surface 102 opposite to the first surface 101 of the substrate 100.

The substrate 100 is a support substrate for the transistor 200 and the light emitting diode 300. An amorphous glass substrate or the like can be used as the substrate 100.

The base layer 110 is provided on the substrate 100. The base layer 110 can prevent diffusion of impurities from the substrate 100 or impurities from the outside (e.g., moisture or sodium (Na)). For example, a silicon nitride ($SiN_x$) film or the like can be used as the base layer 110. Further, for example, a laminated film of a silicon oxide ($SiO_x$) film and a silicon nitride ($SiN_x$) film can be used as the base layer 110.

The first buffer layer 120 and the second buffer layer 130 are provided on the base layer 110. By providing the first buffer layer 120 and the second buffer layer 130, the crystallinity of each of a first gallium nitride layer 210 of the transistor 200 formed on the first buffer layer 120 and a second gallium nitride layer 310 of the light emitting diode 300 formed on the second buffer layer 130 can be improved. In addition, the details of the first gallium nitride layer 210 and the second gallium nitride layer 310 are described later. For example, a conductive film such as a titanium (Ti) film or a titanium nitride ($TiN_x$) film, or a transparent film such as an aluminum nitride film ($AlN_x$) can be used for each of the first buffer layer 120 and the second buffer layer 130. Each of the first buffer layer 120 and the second buffer layer 130 may be a single film or a laminated film. Further, it is preferable that the first buffer layer 120 and the second buffer layer 130 have a c-axis orientation with respect to the substrate 100. Since the first buffer layer 120 and the second buffer layer 130 have the c-axis orientation, the first gallium nitride layer 210 and the second gallium nitride layer 310 can be crystal-grown to have a c-axis orientation. The titanium film, the titanium nitride film, or the aluminum nitride film as described above can be formed to have the c-axis orientation by sputtering.

Further, when the first buffer layer 120 and the second buffer layer 130 are the titanium nitride film or the aluminum nitride film, the base layer 110 may not be provided. Since nitrogen contained in titanium nitride or aluminum nitride has high electronegativity, the first buffer layer 120 and the second buffer layer 130 can trap impurities contained in the substrate 100. That is, when the first buffer layer 120 and the second buffer layer 130 are the titanium nitride film or the aluminum nitride film, the first buffer layer 120 and the second buffer layer 130 may have the function of the base layer 110.

The transistor 200 is provided over the first buffer layer 120. The transistor 200 includes the first gallium nitride layer 210, an aluminum gallium nitride layer 220, a p-type gallium nitride layer 230, a gate electrode 240, a source electrode 250, and a drain electrode 260.

The first gallium nitride layer 210 is provided on the first buffer layer 120. For example, a gallium nitride (GaN) film can be used as the first gallium nitride layer 210. Since the first gallium nitride layer 210 is provided in contact with the first buffer layer 120, the crystal growth of the first gallium nitride layer 210 is controlled by the first buffer layer 120. Specifically, the first gallium nitride layer 210 includes the gallium nitride film having the c-axis orientation with respect to the substrate 100.

The aluminum gallium nitride layer 220 is provided on the first gallium nitride layer 210. For example, an aluminum gallium nitride (AlGaN) film or the like can be used as the aluminum gallium nitride layer 220.

The p-type gallium nitride layer 230 is provided on the aluminum gallium nitride layer 220. For example, a gallium nitride (GaN) film doped with magnesium (Mg) can be used as the p-type gallium nitride layer 230.

The gate electrode 240 is provided on the p-type gallium nitride layer 230, and the source electrode 250 and the drain electrode 260 are provided on the aluminum gallium nitride layer 220. Metal such as nickel (Ni) or gold (Au) can be used for the gate electrode 240. Further, for example, metal such as titanium (Ti) or aluminum (Al) can be used for the source electrode 250 and the drain electrode 260.

Although the transistor 200 is a so-called HEMT (High Electron Mobility Transistor), the configuration of HEMT is not limited to the configuration described above. The transistor 200 may be a transistor including the first gallium nitride layer 210.

The light emitting diode 300 is provided over the second buffer layer 130. The light emitting diode 300 includes the second gallium nitride layer 310, an n-type semiconductor layer 320, a light emitting layer 330, a p-type semiconductor layer 340, an n-type electrode 350, and a p-type electrode 360.

The second gallium nitride layer 310 is provided on the second buffer layer 130. For example, a gallium nitride (GaN) film can be used as the second gallium nitride layer 310. Since the second gallium nitride layer 310 is provided in contact with the second buffer layer 130, the crystal growth of the second gallium nitride layer 310 is controlled by the second buffer layer 130. Specifically, the second gallium nitride layer 310 includes the gallium nitride film having the c-axis orientation with respect to the substrate 100.

The n-type semiconductor layer 320 is provided on the second gallium nitride layer 310. For example, a gallium nitride (GaN) film doped with silicon (Si) can be used as the n-type semiconductor layer 320.

The light emitting layer 330 is provided on the n-type semiconductor layer 320. For example, a laminated film in which an indium gallium nitride (InGaN) film and a gallium nitride (GaN) film are alternately laminated can be used as the light emitting layer 330.

The p-type semiconductor layer 340 is provided on the light emitting layer 330. For example, a gallium nitride (GaN) film doped with magnesium (Mg) can be used as the p-type semiconductor layer 340.

The n-type electrode 350 and the p-type electrode 360 are provided on the n-type semiconductor layer 320 and the p-type semiconductor layer 340, respectively. For example, metal such as indium (In) can be used for the n-type electrode 350. For example, metal such as palladium (Pd) or gold (Au) can be used for the p-type electrode 360.

Although the light emitting diode 300 is a so-called micro LED or mini-LED, the light emitting diode 300 is not limited thereto. In addition, the micro LED refers to an LED with a side equal to or less than 100 μm or less, and the mini LED refers to an LED with a side greater than 100 μm.

Although not shown in the figures, a protective film can be provided to cover the transistor 200 or the light emitting diode 300 as necessary. A silicon nitride ($SiN_x$) film can be used as the protective film. Further, for example, a laminated film of a silicon oxide ($SiO_x$) film and a silicon nitride ($SiN_x$) film can be used as the protective film.

The light shielding wall 140 is provided between the transistor 200 and the light emitting diode 300. The light shielding wall 140 can block light emitted from the light emitting diode 300 and prevent the transistor 200 from being irradiated with light. For example, an acrylic resin added with carbon (resin black) can be used for the light shielding wall 140.

The light shielding layer 150 is provided on the second surface 102 of the substrate 100. The light shielding layer 150 can block external light and prevent the transistor 200 from being irradiated with light. For example, an acrylic resin added with carbon (resin black) can be used for the light shielding layer 150.

The interlayer film 160 is provided to cover the transistor 200, the light emitting diode 300, and the light shielding wall 140. The interlayer film 160 can planarize unevenness of the transistor 200, the light emitting diode 300, and the light shielding wall 140. For example, an organic insulating film such as an acrylic resin film or a polyimide resin film can be used for the interlayer film 160. The interlayer film 160 may be a single film or a laminated film. When the interlayer film 160 is a laminated film, the interlayer film 160 may include not only the organic insulating film but also an inorganic insulating film such as a silicon oxide ($SiO_x$) film or a silicon nitride ($SiN_x$) film.

The conductive layer 170 and the transparent conductive layer 180 are provided on the interlayer film 160. The conductive layer 170 is provided to be electrically connected to the gate electrode 240 through an opening provided in the interlayer film 160. Further, the transparent conductive layer 180 is provided so as to be electrically connected to the drain electrode 260 and the p-type electrode 360 through openings provided in the interlayer film 160. Light emitted from the light emitting layer 330 of the light emitting diode 300 is transmitted through the transparent conductive layer 180 and emitted to the outside. For example, a laminated metal film of aluminum and titanium (Al/Ti film) can be used as the conductive layer 170. For example, a transparent conductive film such as an indium tin oxide (ITO) film or an indium zinc oxide (IZO) film can be used as the transparent conductive layer 180.

3. Manufacturing Method of Display Device 10

Figure 4:
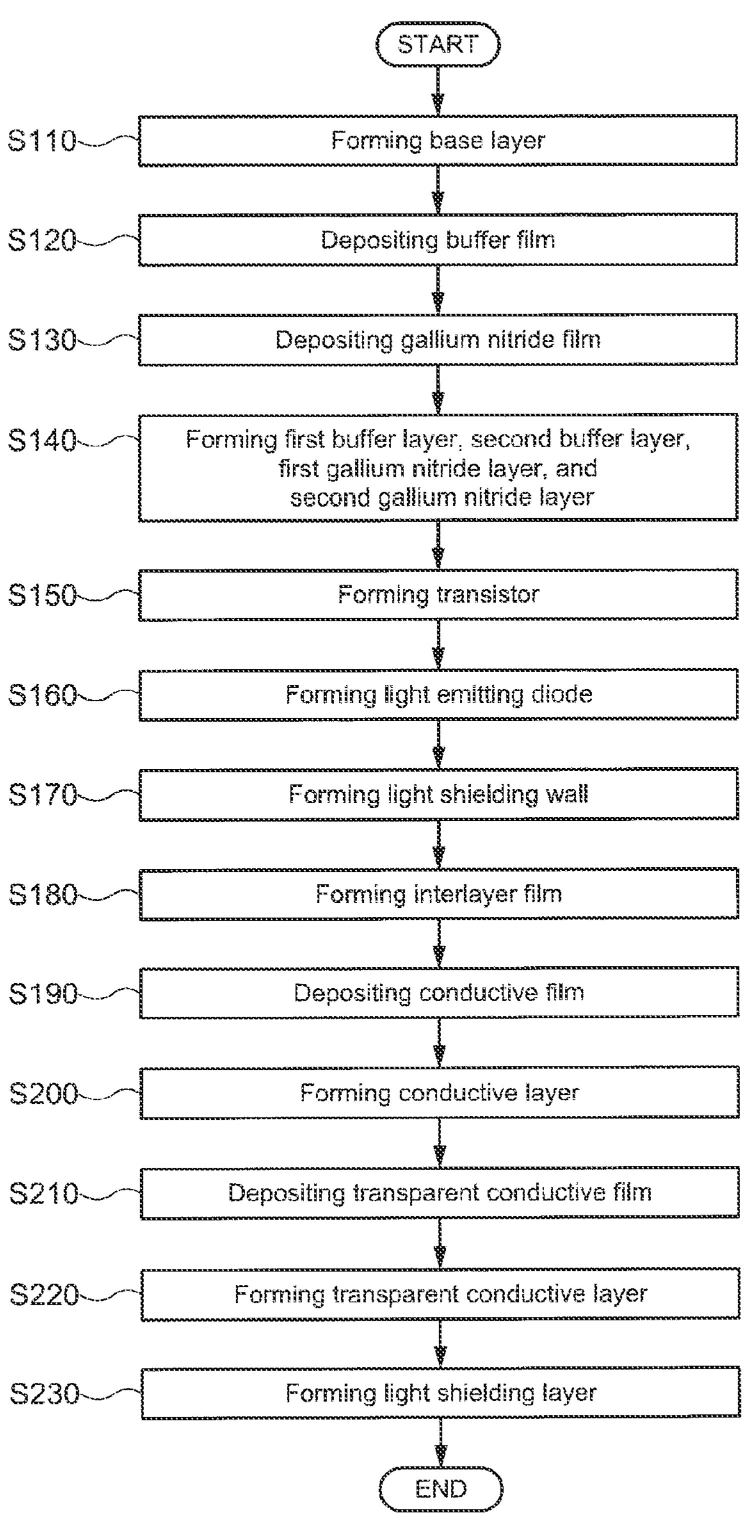
FIG. 4 is a flow chart showing a method for manufacturing a display device according to an embodiment of the present invention.
Figure 5A:
FIG. 5A is a cross-sectional view showing a method for manufacturing a display device according to an embodiment of the present invention.
Figure 5A:
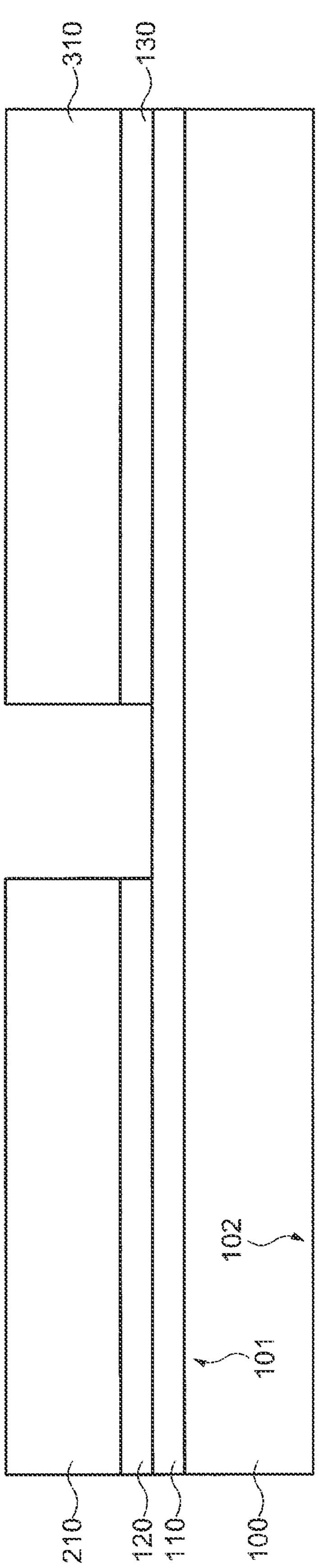
Figure 5B:
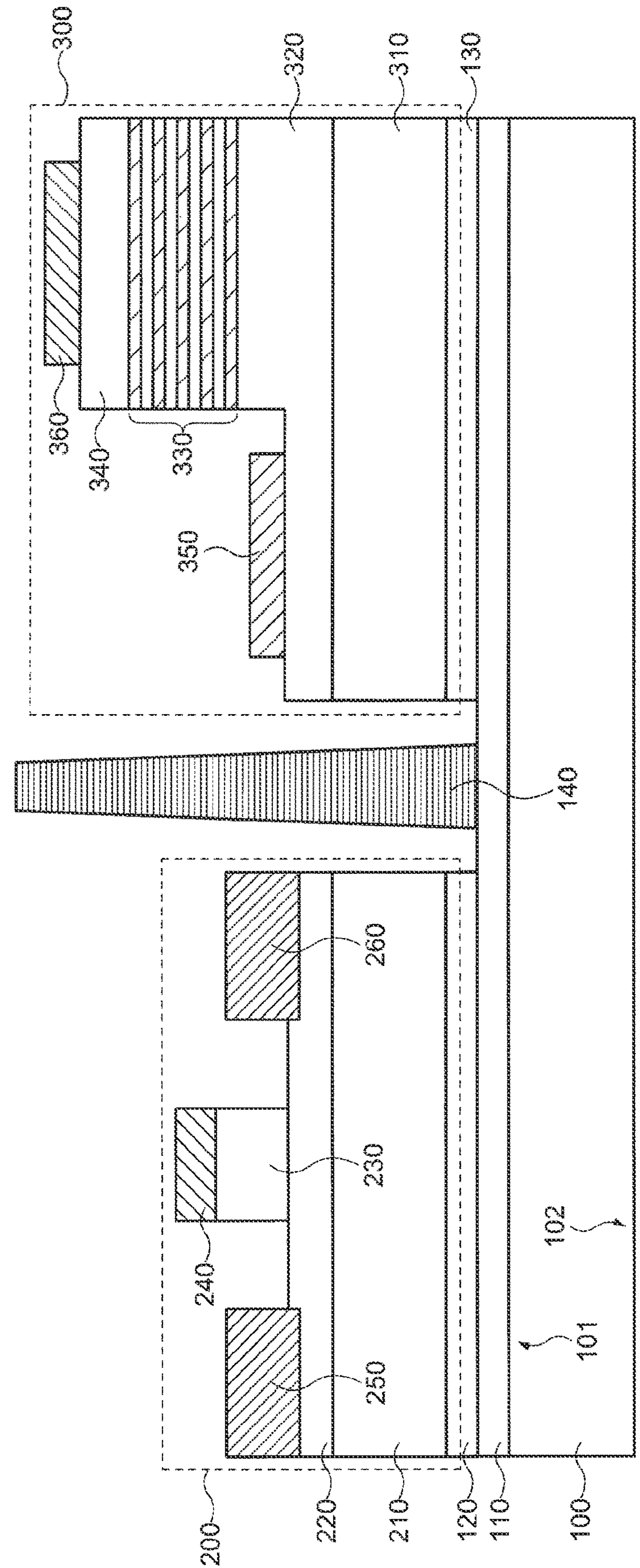
FIG. 5B is a cross-sectional view showing a method for manufacturing a display device according to an embodiment of the present invention.
Figure 5C:
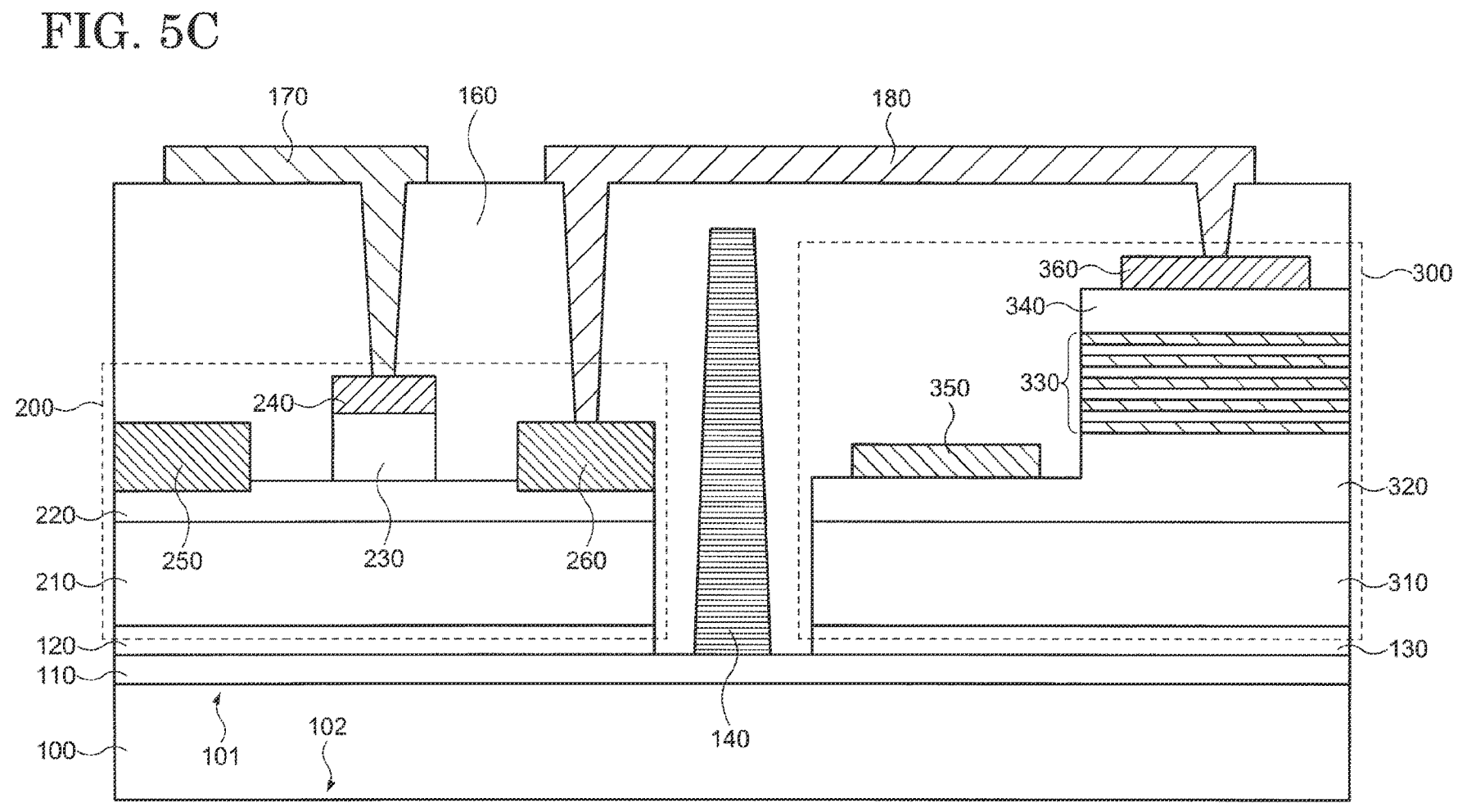

FIG. 4 is a flow chart showing a method for manufacturing the display device 10 according to an embodiment of the present invention. Further, FIGS. 5A to 5C are cross-sectional views showing a method for manufacturing the display device 10 according to an embodiment of the present invention.

In step S110, the base layer 110 is formed on the substrate 100 such as an amorphous glass substrate. The base layer 110 can be formed using sputtering or CVD.

In step S120, a titanium film is formed on the base layer 110. The titanium film can be deposited using sputtering. The titanium film having the c-axis orientation is obtained by sputtering.

In step S130, a gallium nitride film is formed on the titanium film. The gallium nitride film can be deposited using sputtering. Since sputtering is used to deposit the gallium nitride film, the gallium nitride film can be formed over the substrate 100 such as the amorphous glass substrate without the high temperature. Further, since the gallium nitride film is formed on the titanium film having the c-axis orientation, the crystal growth of the gallium nitride film can be controlled even at a low temperature. Specifically, the gallium nitride film having a c-axis orientation is obtained.

Here, the deposition of the gallium nitride film using sputtering is described.

The substrate 100, such as an amorphous glass substrate, is placed in a vacuum chamber facing a gallium nitride target. It is preferable that the composition ratio of gallium nitride in the gallium nitride target is greater than or equal to 0.7 and less than or equal to 2 of gallium to nitrogen. Nitrogen can also be supplied to the vacuum chamber as a gas other than the sputtering gas (such as argon or krypton). In that case, it is preferable that the composition ratio of gallium nitride in the gallium nitride target is more gallium than nitrogen. For example, nitrogen can be supplied using a nitrogen radical source. The sputtering power supply source may be either a DC power supply source, an RF power supply source, or a pulsed DC power supply source.

The substrate 100 in the vacuum chamber may be heated. For example, the substrate 100 can be heated at a temperature greater than or equal to 400 degrees and less than 600 degrees. This substrate temperature can be applied to an amorphous glass substrate having low heat resistance. Further, this substrate temperature is lower than the deposition temperature in MOCVD or HYPE.

After the vacuum chamber is sufficiently evacuated, the sputtering gas is supplied to the vacuum chamber. Further, a voltage is applied between the substrate 100 and the gallium nitride target at a predetermined pressure to generate plasma and the gallium nitride film is deposited.

Although the method for forming the gallium nitride film by sputtering is described above, the configuration or conditions of sputtering can be changed as appropriate. In addition, an aluminum gallium nitride film can be formed by using an aluminum gallium nitride target instead of the gallium nitride target.

In step S140, the buffer film and the gallium nitride film are etched using photolithography to form the first buffer layer 120, the second buffer layer 130, the first gallium nitride layer 210, and the second gallium nitride layer 310 (see FIG. 5A). When the transistor 200 is formed in step S140, a region where the transistor 200 is formed and a region where the light emitting diode 300 is formed are separated.

In step S150, the remaining layers included in the transistor 200 are formed over first gallium nitride layer 210. The details of step S150 are described later.

In step S160, the remaining layers included in the light emitting diode 300 are formed over the second gallium nitride layer 310. The details of step S160 are described later.

In step S170, the light shielding wall 140 is formed on the base layer 110 between the transistor 200 and the light emitting diode 300 (see FIG. 5B). In addition, the light shielding wall 140 can be formed using photolithography.

In step S180, the interlayer film 160 is formed to cover the transistor 200, the light emitting diode 300, and the light shielding wall 140. Further, openings are formed in the interlayer film 160 using photolithography, if necessary.

In step S190, a conductive film is formed on the interlayer film 160. The conductive film can be deposited using sputtering.

In step S200, the conductive film is etched using photolithography to form the conductive layer 170.

In step S210, a transparent conductive film is formed on the interlayer film 160. The transparent conductive film can be deposited using sputtering.

In step S220, the transparent conductive film is etched using photolithography to form the transparent conductive layer 180 (see FIG. 5C).

In step S230, the light shielding layer 150 is formed on the second surface 102 of the substrate 100.

Although the display device 10 shown in FIG. 3 can be manufactured by the manufacturing method described above, the method for manufacturing the display device 10 is not limited thereto. The order of steps may be changed as appropriate. For example, step S150 and step S160 may be changed.

Here, the method for manufacturing the transistor 200 in step S150 is described with reference to FIGS. 6A to 6C and the method for manufacturing the light emitting diode 300 in step S160 is described with reference to FIGS. 7A to 7C.

Figure 6A:
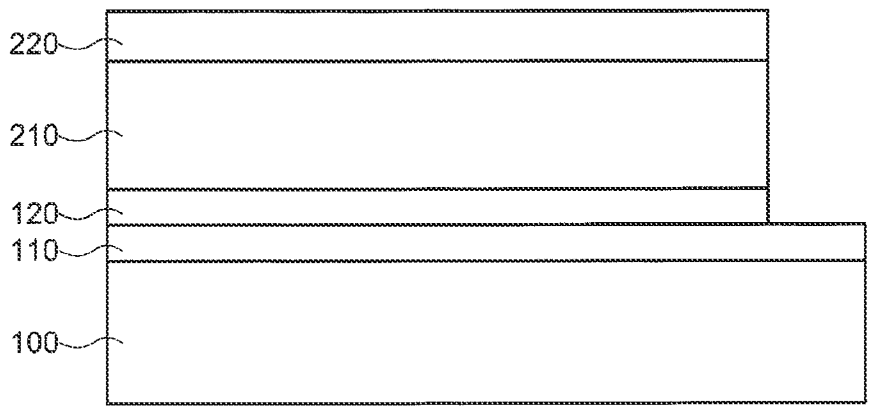
FIG. 6A is a cross-sectional view showing a method for manufacturing a transistor of a display device according to an embodiment of the present invention.
Figure 6B:
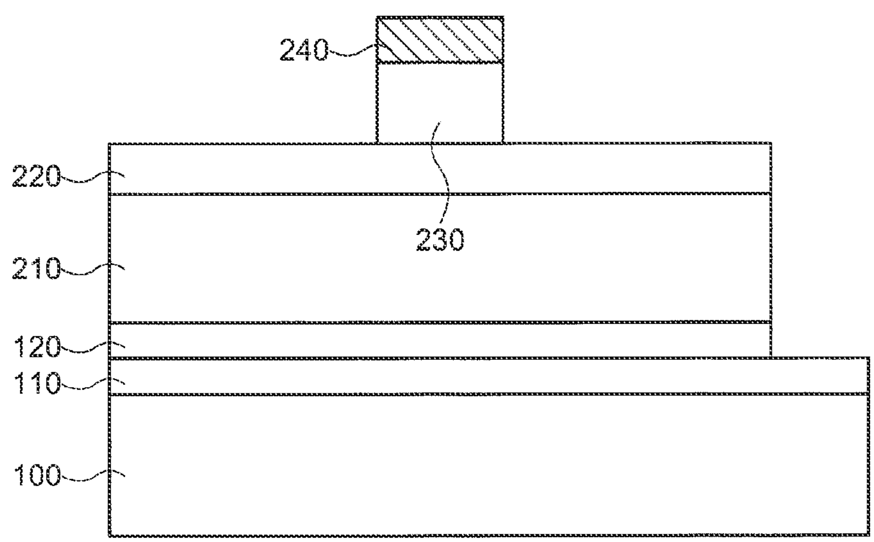
FIG. 6B is a cross-sectional view showing a method for manufacturing a transistor of a display device according to an embodiment of the present invention.
Figure 6C:
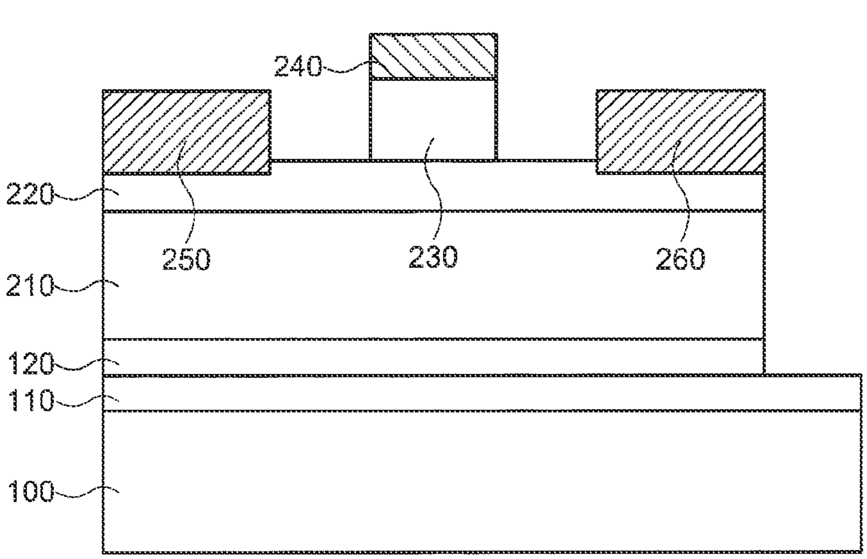
FIG. 6C is a cross-sectional view showing a method for manufacturing a transistor of a display device according to an embodiment of the present invention.

FIGS. 6A to 6C are cross-sectional views showing the method for manufacturing the transistor 200 of the display device 10 according to an embodiment of the present invention.

First, an aluminum gallium nitride film is deposited on the first gallium nitride layer 210 by sputtering, and then photolithography is used to form the aluminum gallium nitride layer 220 (see FIG. 6A).

Next, a gallium nitride film doped with magnesium and a metal film are deposited over the aluminum gallium nitride layer 220 by sputtering, and then photolithography is used to form the p-type gallium nitride layer 230 and the gate electrode 240 (FIG. 6B).

Next, a metal film is deposited on the aluminum gallium nitride layer 220 using sputtering, and then photolithography is used to form the source electrode 250 and the drain electrode 260 (FIG. 6C).

Although the transistor 200 can be formed over the substrate 100 such as the amorphous glass substrate by the above manufacturing method, the method for manufacturing the transistor 200 is not limited thereto.

Figure 7A:
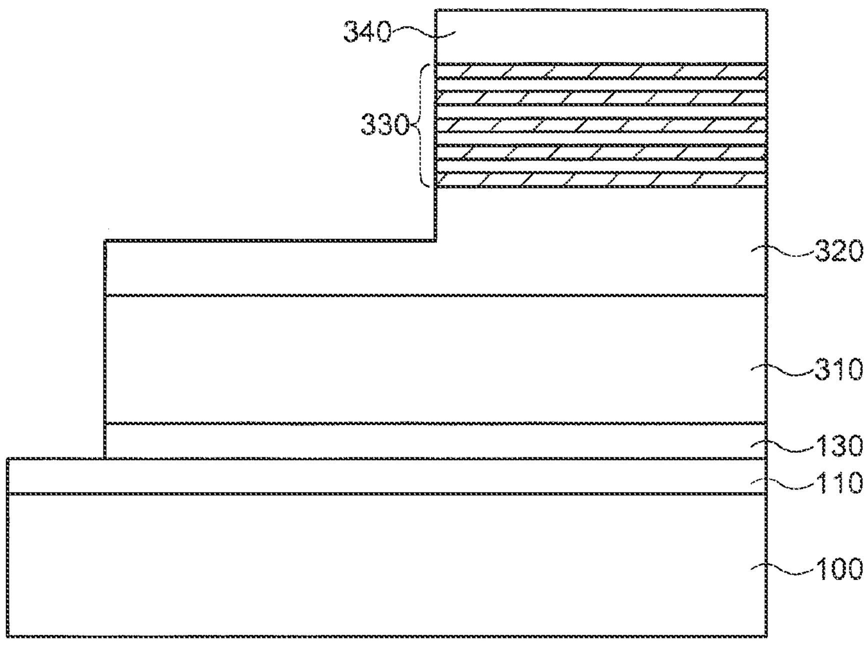
FIG. 7A is a cross-sectional view showing a method for manufacturing a light emitting diode of a display device according to an embodiment of the present invention.
Figure 7B:
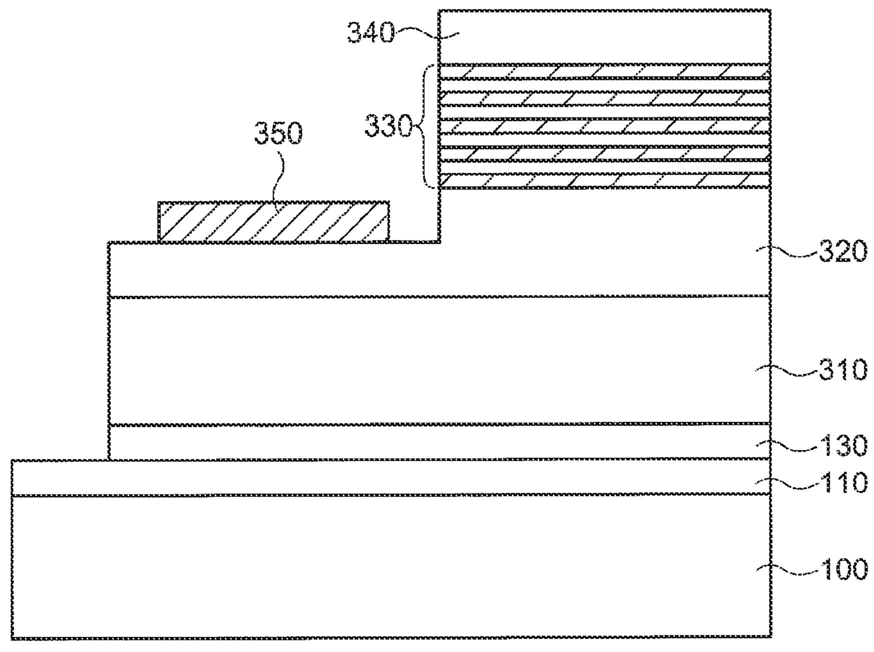
FIG. 7B is a cross-sectional view showing a method for manufacturing a light emitting diode of a display device according to an embodiment of the present invention.
Figure 7C:
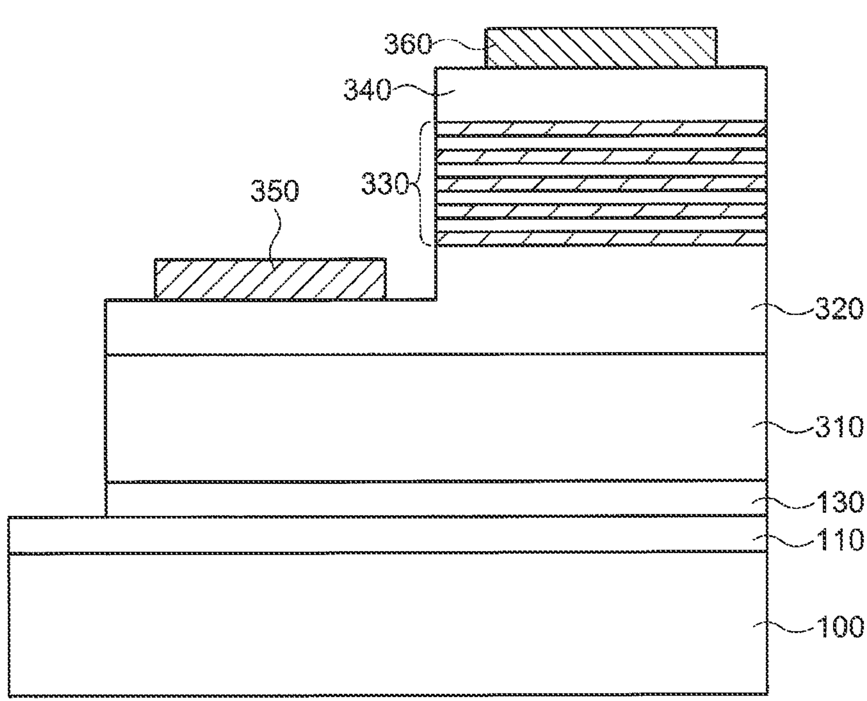
FIG. 7C is a cross-sectional view showing a method for manufacturing a light emitting diode of a display device according to an embodiment of the present invention.

FIGS. 7A to 7C are cross-sectional views showing the method for manufacturing the light emitting diode 300 of the display device 10 according to an embodiment of the present invention.

First, a gallium nitride film doped with silicon, a laminated film in which an indium gallium nitride film and a gallium nitride film are alternately laminated, and a gallium nitride film doped with silicon over the second gallium nitride layer 310 are deposited by sputtering, and then photolithography is used to form the n-type semiconductor layer 320, the light-emitting layer 330, and the p-type semiconductor layer 340 (see FIG. 7A). Further, as shown in FIG. 7A, the n-type semiconductor layer 320 is etched so that a part of the surface is exposed.

Next, a metal film of gold and palladium is deposited on the exposed n-type semiconductor layer 320 using sputtering, and then photolithography is used to form the n-type electrode 350 (see FIG. 7B).

Next, a metal film of gold and indium is deposited on the p-type semiconductor layer 340 using sputtering, and then photolithography is used to form the p-type electrode 360 (see FIG. 7C).

Although the light emitting diode 300 can be formed on the substrate 100 such as the amorphous glass substrate by the manufacturing method described above, the method for manufacturing the light emitting diode 300 is not limited thereto. For example, a protective film can be formed to cover the n-type semiconductor layer 320, the light emitting layer 330, and the p-type semiconductor layer 340 before forming the n-type electrode 350 and the p-type electrode 360. In this case, after forming the openings in the protective film, the n-type electrode 350 and the p-type electrode 360 which are electrically connected to the n-type semiconductor layer 320 and the p-type semiconductor layer 340 through the openings, respectively, are formed. In addition, the protective film can also be formed after the n-type electrode 350 and the p-type electrode 360 are formed.

By the manufacturing method described above, the display device 10 in which not only the transistor 200 but also the light emitting diode 300 are formed over the substrate 100 such as the amorphous glass substrate with low heat resistance can be manufactured.

In this embodiment, the first gallium nitride layer 210 is formed on the first buffer layer 120 and the second gallium nitride layer 310 is formed on the second buffer layer 130. Although each of the first gallium nitride layer 210 and the second gallium nitride layer 310 is formed at a low temperature using sputtering, the first gallium nitride layer 210 and the second gallium nitride layer 310 maintain proper crystallinity because the first buffer layer 120 and the second buffer layer 130 are provided. Therefore, the transistor 200 including the first gallium nitride layer 210 and the light emitting diode 300 including the second gallium nitride layer 310 can be formed over the substrate 100 such as the amorphous glass substrate with low heat resistance. That is, it is possible to provide the display device 10 including the transistor 200 and the light emitting diode 300 using the gallium nitride layers formed over the amorphous glass substrate.

Modification 1

A display device 10A, which is a modification of the display device 10, is described with reference to FIG. 8. In addition, when a configuration of the display device 10A is the same as the configuration of the display device 10, the description of the configuration of the display device 10A may be omitted.

Figure 8:
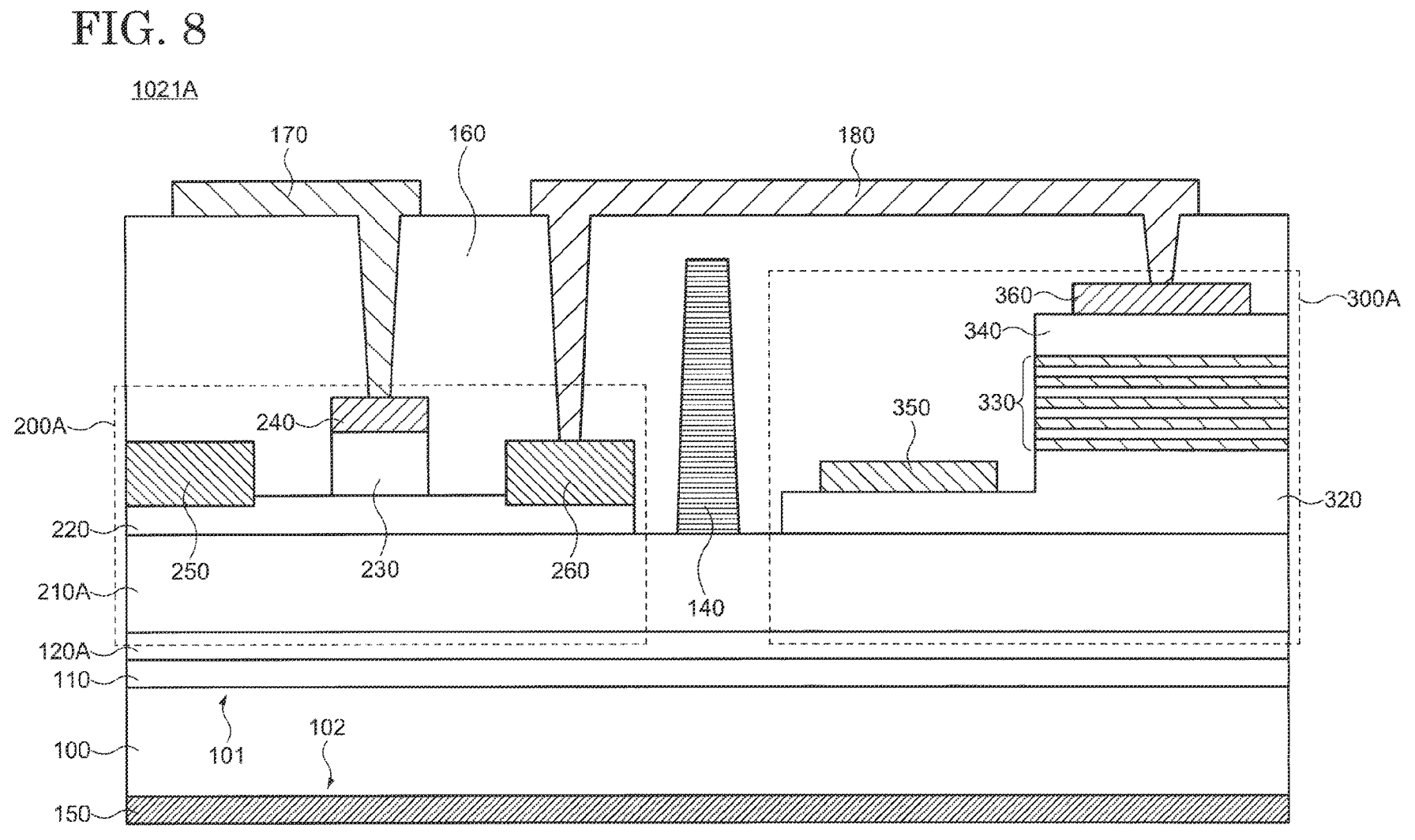

FIG. 8 is a cross-sectional view of a pixel 1021A of the display device 10A according to an embodiment of the present invention. As shown in FIG. 8, the display device 10A includes the substrate 100, the base layer 110, a buffer layer 120A, a transistor 200A, a light emitting diode 300A, the light shielding wall 140, the light shielding layer 150, the interlayer film 160, the conductive layer 170, and the transparent conductive layer 180.

The buffer layer 120A is provided on the base layer 110. The buffer layer 120A can use the same film as the first buffer layer 120 or the second buffer layer described above. In other words, the buffer layer 120A is the same layer that is not separated into first buffer layer 120 and the second buffer layer 130. The transistor 200A and the light emitting diode 300A are provided over the buffer layer 120A. That is, the transistor 200A and the light emitting diode 300A are provided over the common buffer layer 120A. The buffer layer 120A is preferably an insulating film such as an aluminum nitride film in order to electrically isolate the transistor 200A and the light emitting diode 300A.

The transistor 200A and the light emitting diode 300A include the gallium nitride layer 210A provided on and in contact with the buffer layer 120A as the common layer. The gallium nitride layer 210A can use the same film as the first gallium nitride layer 210 or the second gallium nitride layer 310 described above. In other words, the gallium nitride layer 210A is the same layer that is not separated into the first gallium nitride layer 210 and the second gallium nitride layer 310.

In this modification, the gallium nitride layer 210A is formed on the buffer layer 120A. Although the gallium nitride layer 210A is formed at a low temperature using sputtering, the gallium nitride layer 210A maintains proper crystallinity because the buffer layer 120A is provided. Therefore, the transistor 200A and the light emitting diode 300A including the common gallium nitride layer 210A can be formed over the substrate 100 such as the amorphous glass substrate with low heat resistance. That is, it is possible to provide the display device 10A including the transistor 200A and the light emitting diode 300A using the gallium nitride layers formed over the amorphous glass substrate.

Modification 2

A display device 10B, which is another modification of the display device is described with reference to FIG. 9. In addition, when a configuration of the display device 10B is the same as the configuration of the display device 10, the description of the configuration of the display device 10B may be omitted.

Figure 9:
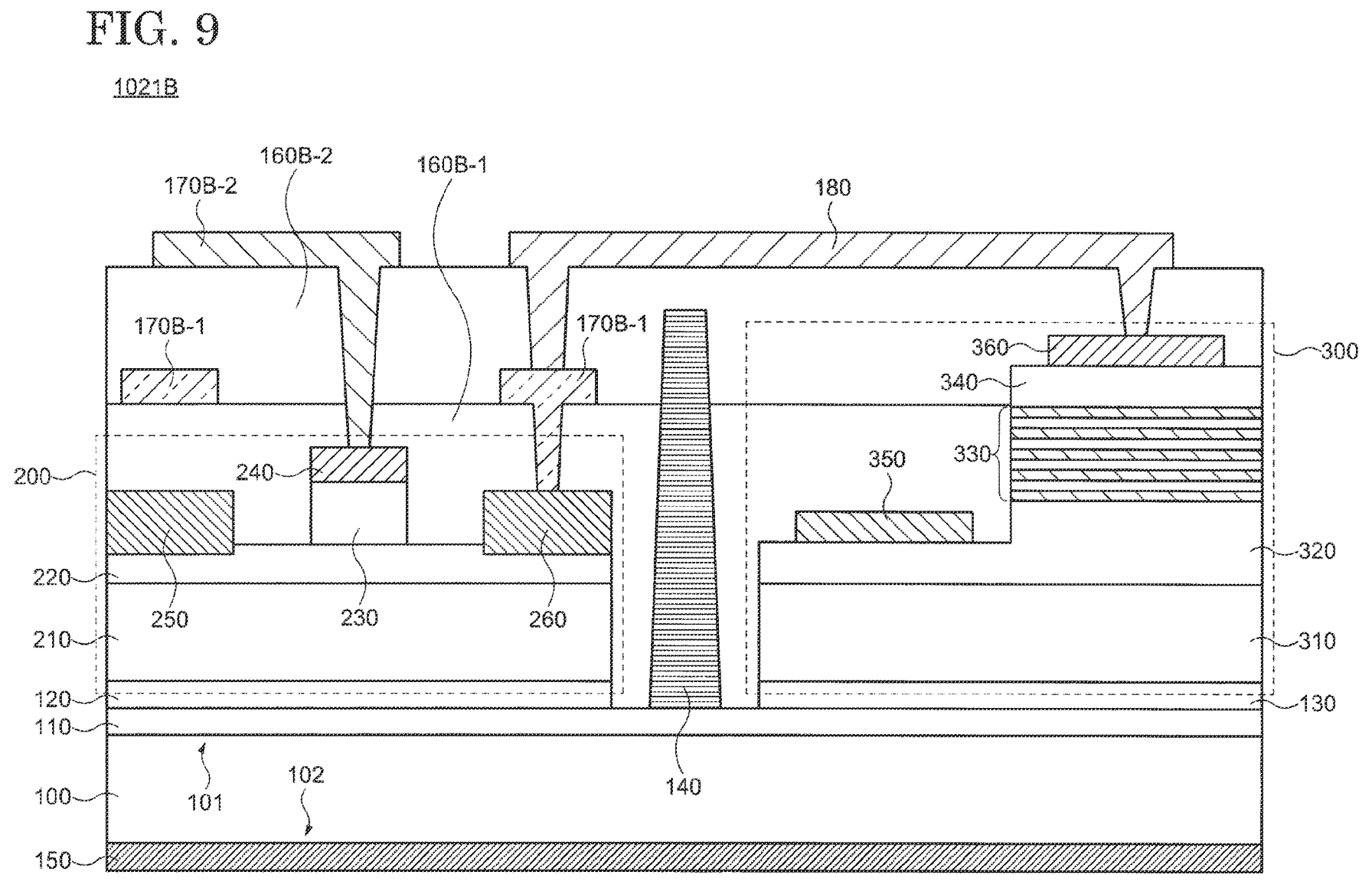

FIG. 9 is a cross-sectional view of a pixel 1021B of the display device 10B according to an embodiment of the present invention. As shown in FIG. 9, the display device 10B includes the substrate 100, the base layer 110, the first buffer layer 120, the transistor 200, the second buffer layer 130, the light emitting diode 300, the light shielding wall 140, the light shielding layer 150, a first interlayer film 160B-1, a first conductive layer 170B-1, a second interlayer film 160B-2, a second conductive layer 170B-2, and the transparent conductive layer 180.

The first interlayer film 160B-1 is provided to cover at least one of the transistor 200, the light emitting diode 300, or the light shielding wall 140. The first conductive layer 170B-1 is provided on the first interlayer film 160B-1. Further, the second interlayer film 160B-2 is provided so as to cover the first interlayer film 160B-1 and the first conductive layer 170B-1. The second conductive layer 170B-2 is provided on the second interlayer film 160B-2.

The first interlayer film 160B-1 and the second interlayer film 160B-2 can use the same organic insulating film as the interlayer film 160 described above. Further, the first conductive layer 170B-1 and the second conductive layer 170B-2 can use the same metal film as the conductive layer 170 described above.

When the transistor 200 and the light emitting diode 300 are provided over the same substrate 100, the height of the transistor 200 and the height of the light-emitting diode 300 may be significantly different from each other. That is, the unevenness of the transistor 200 or the light emitting diode 300 may be large. In that case, when the first interlayer film 160B-1 and the second interlayer film 160B-2 are provided, the unevenness of the transistor 200, the light emitting diode 300, and the light shielding wall 140 can be planarized. Further, when the first conductive layer 170B-1 is provided between the first interlayer film 160B-1 and the second interlayer film 160B-2, the first conductive layer 170B-1 can be used as a connection electrode. Furthermore, when the first conductive layer 170B-1 is provided, the diameter of the openings provided in the first interlayer film 160B-1 and the second interlayer film 160B-2 can be reduced. Moreover, the first conductive layer 170B-1 can also function as wiring.

In addition, although the two interlayer films are described above as an example, three or more interlayer films may be used in this modification. Further, the first conductive layer 170B-1 can be provided between each interlayer film.

In this modification, even when the unevenness of the transistor 200 and the light emitting diode 300 is large, the unevenness of the transistor 200 and the light emitting diode can be planarized by providing a plurality of interlayer films. Further, the first conductive layer 170B-1 can be provided between each interlayer film, and the first conductive layer 170B-1 can function as a connection electrode or a wiring.

Modification 3

A transistor 200C, which is a modification of the transistor 200, is described with reference to FIG. 10. In addition, when a configuration of the transistor 200C is the same as the configuration of the transistor 200, the description of the configuration of the transistor 200C may be omitted.

Figure 10:
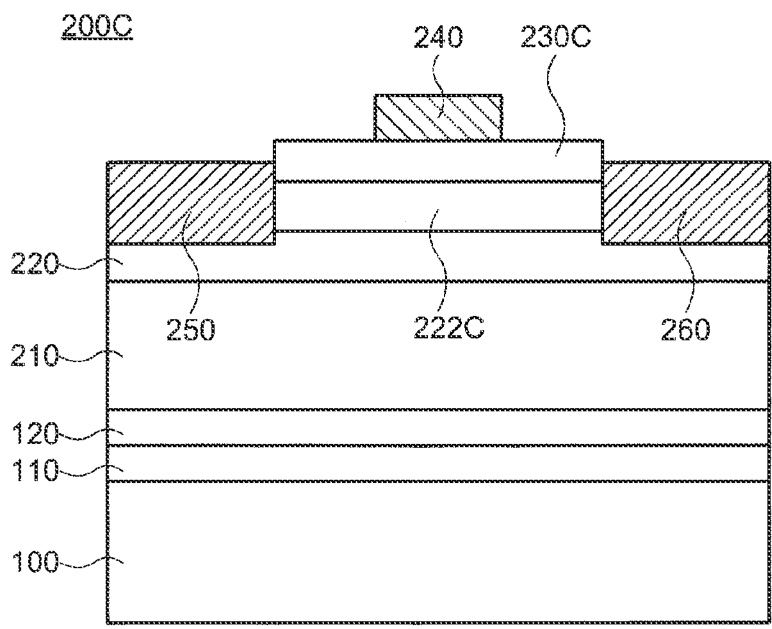
FIG. 10 is a cross-sectional view of a transistor of a display device according to an embodiment of the present invention.

FIG. 10 is a cross-sectional view of the transistor 200C of the display device 10 according to an embodiment of the present invention. As shown in FIG. the transistor 200C is provided over the first buffer layer 120. The transistor 200C includes the first gallium nitride layer 210, the aluminum gallium nitride layer 220, a cap layer 222C, a p-type indium gallium nitride layer 230C, the gate electrode 240, the source electrode 250, and the drain electrode 260.

The cap layer 222C is provided on the aluminum gallium nitride layer 220. For example, a gallium nitride film can be used as the cap layer 222C.

The p-type indium gallium nitride layer 230C is provided on the cap layer 222C.

An aluminum gallium nitride film, a gallium nitride film, and an indium gallium nitride film are deposited on the first gallium nitride layer 210 by sputtering, and then can be etched using photolithography to form the cap layer 222C and the p-type indium gallium nitride layer 230C simultaneously with the aluminum gallium nitride layer 220.

Since the transistor 200C according to this modification also includes the first gallium nitride layer 210 provided on the first buffer layer 120, the transistor 200C can be formed over the amorphous glass substrate.

Modification 4

A transistor 200D, which is another modification of transistor 200, is described with reference to FIGS. 11 and 12A to 12C. In addition, when a configuration of the transistor 200D is the same as the configuration of the transistor 200, the description of the configuration of the transistor 200D may be omitted.

Figure 11:
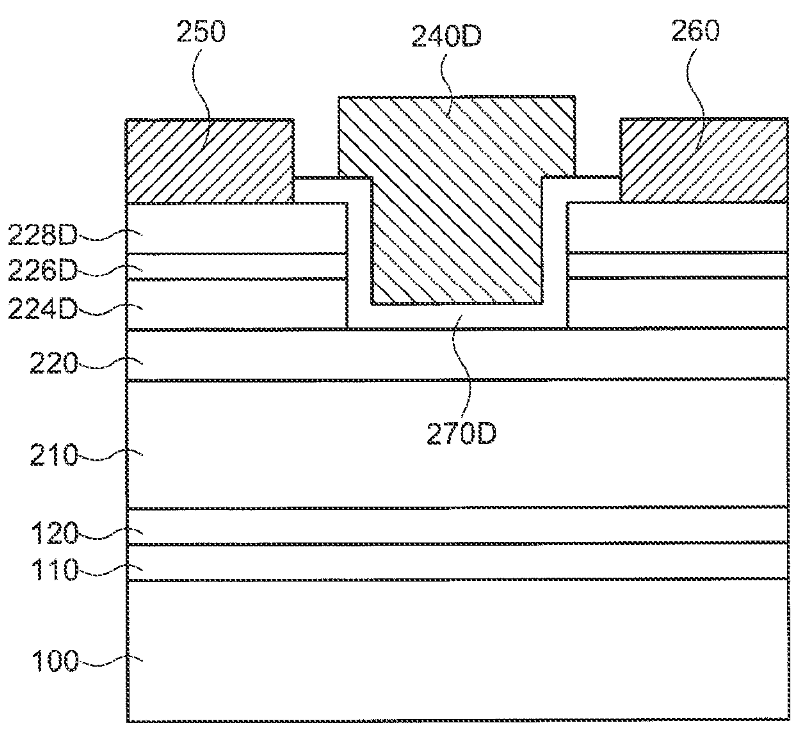
FIG. 11 is a cross-sectional view of a transistor of a display device according to an embodiment of the present invention.

FIG. 11 is a cross-sectional view of the transistor 200D of the display device 10 according to an embodiment of the present invention. As shown in FIG. 11, the transistor 200D is provided over the first buffer layer 120. The transistor 200D includes the first gallium nitride layer 210, the aluminum gallium nitride layer 220, a first undoped gallium nitride layer 224D, an n-type gallium nitride layer 226D, a second undoped gallium nitride layer 228D, an oxide layer 270D, and a gate electrode 240D, the source electrode 250, and the drain electrode 260.

The first undoped gallium nitride layer 224D is provided on the aluminum gallium nitride layer 220. For example, a gallium nitride (GaN) film can be used for the first undoped gallium nitride layer 224D.

The n-type gallium nitride layer 226D is provided on the first undoped gallium nitride layer 224D. For example, a gallium nitride (GaN) film doped with silicon (Si) can be used as the n-type gallium nitride layer 226D.

The second undoped gallium nitride layer 228D is provided on the n-type gallium nitride layer 226D. For example, a gallium nitride (GaN) film can be used as the second undoped gallium nitride layer 228D.

In an opening which is provided in the first undoped gallium nitride layer 224D, the n-type gallium nitride layer 226D, and the second undoped gallium nitride layer 228D, the oxide layer 270D is formed so as to cover a surface of the aluminum gallium nitride layer 220 exposed from the opening and a side of the opening. For example, an aluminum oxide ($Al_2O_3$) film or the like can be used as the oxide layer 270D.

The gate electrode 240D is provided on the oxide layer 270 so as to fill the opening. The gate electrode 240D can use the same metal film as the gate electrode 240 described above.

Figure 12A:
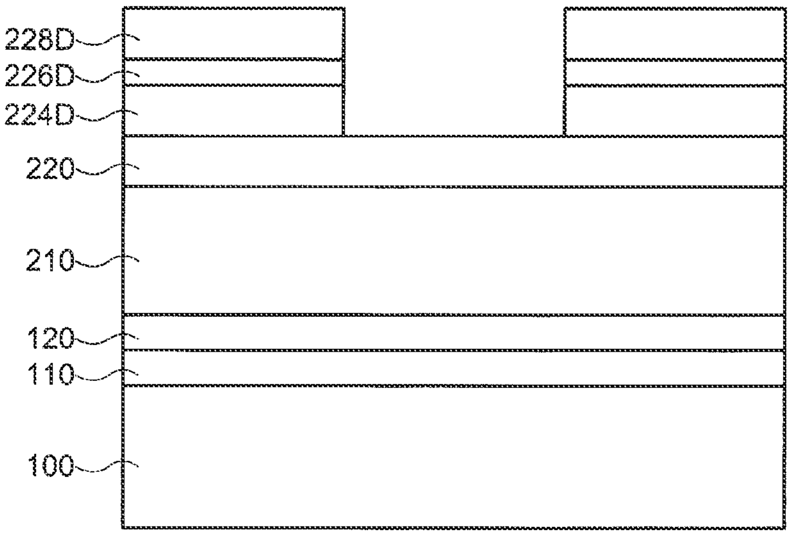
FIG. 12A is a cross-sectional view showing a method for manufacturing a transistor of a display device according to an embodiment of the present invention.
Figure 12B:
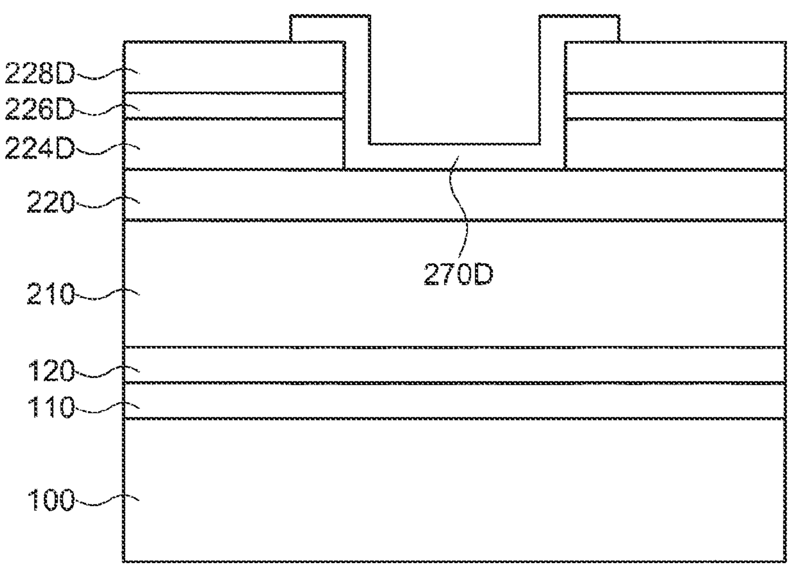
FIG. 12B is a cross-sectional view showing a method for manufacturing a transistor of a display device according to an embodiment of the present invention.
Figure 12C:
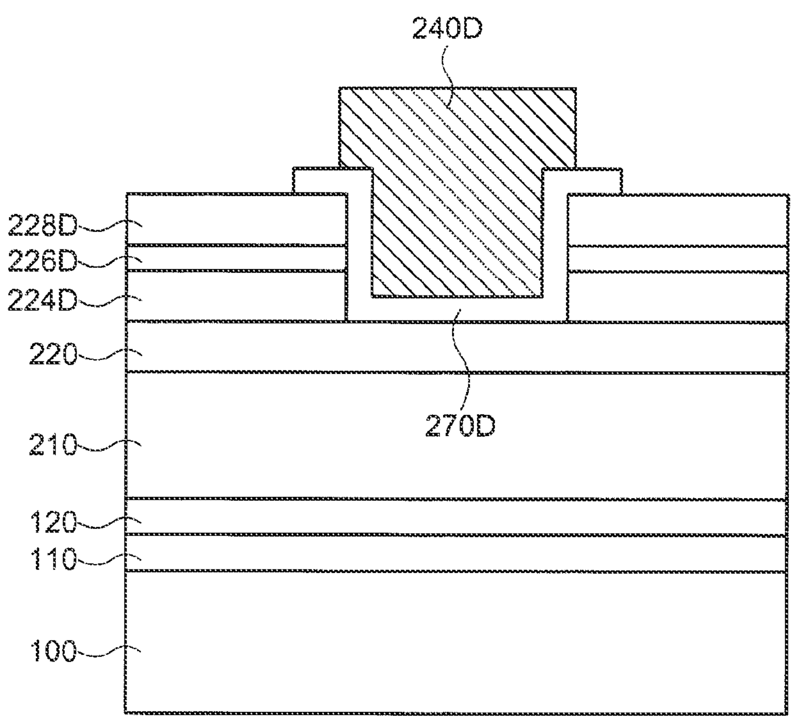
FIG. 12C is a cross-sectional view showing a method for manufacturing a transistor of a display device according to an embodiment of the present invention.

FIGS. 12A to 12C are cross-sectional views showing the method for manufacturing the transistor 200D of the display device 10 according to an embodiment of the present invention.

After forming the aluminum gallium nitride layer 220 (see FIG. 6A), a gallium nitride film, a gallium nitride film doped with silicon, and a gallium nitride film are sequentially formed on the aluminum gallium nitride layer 220 by sputtering. Next, the gallium nitride film, the gallium nitride film doped with silicon, and the gallium nitride film are etched by photolithography to form the first undoped gallium nitride layer 224D, the n-type gallium nitride layer 226D, and the second undoped gallium nitride layer 228D in which the opening is provided (see FIG. 12A). In addition, as shown in FIG. 12A, the opening is etched so that a portion of the surface of the aluminum gallium nitride layer 220 is exposed.

Next, an aluminum oxide film is deposited so as to cover the opening and the surface of the second undoped gallium nitride layer 228D, and then photolithography is used to form the oxide layer 270D (see FIG. 12B). In addition, the oxide layer 270D is etched such that a portion of the second undoped gallium nitride layer 228D is exposed.

Next, a metal film is deposited on the oxide layer 270D using sputtering, and then photolithography is used to form the gate electrode 240D (see FIG. 12C). Since the metal film is deposited so as to fill the opening, the gate electrode 240D is formed on the oxide layer 270 so as to fill the opening.

Next, a metal film is deposited using sputtering on the exposed second undoped gallium nitride layer 228D, and then photolithography is used to form the source electrode 250 and the drain electrode 260.

Although the transistor 200D shown in FIG. 11 can be manufactured by the above manufacturing method, the method for manufacturing the transistor 200D is not limited thereto.

Since the transistor 200D according to this modification also includes the first gallium nitride layer 210 provided on the first buffer layer 120, the transistor 200D can be formed on the amorphous glass substrate.

Second Embodiment

A display device 10E according to an embodiment of the present invention is described with reference to FIG. 13. In addition, when a configuration of the display device 10E is the same as the configuration of the display device 10, the description of the configuration of the display device 10E may be omitted.

Figure 13:
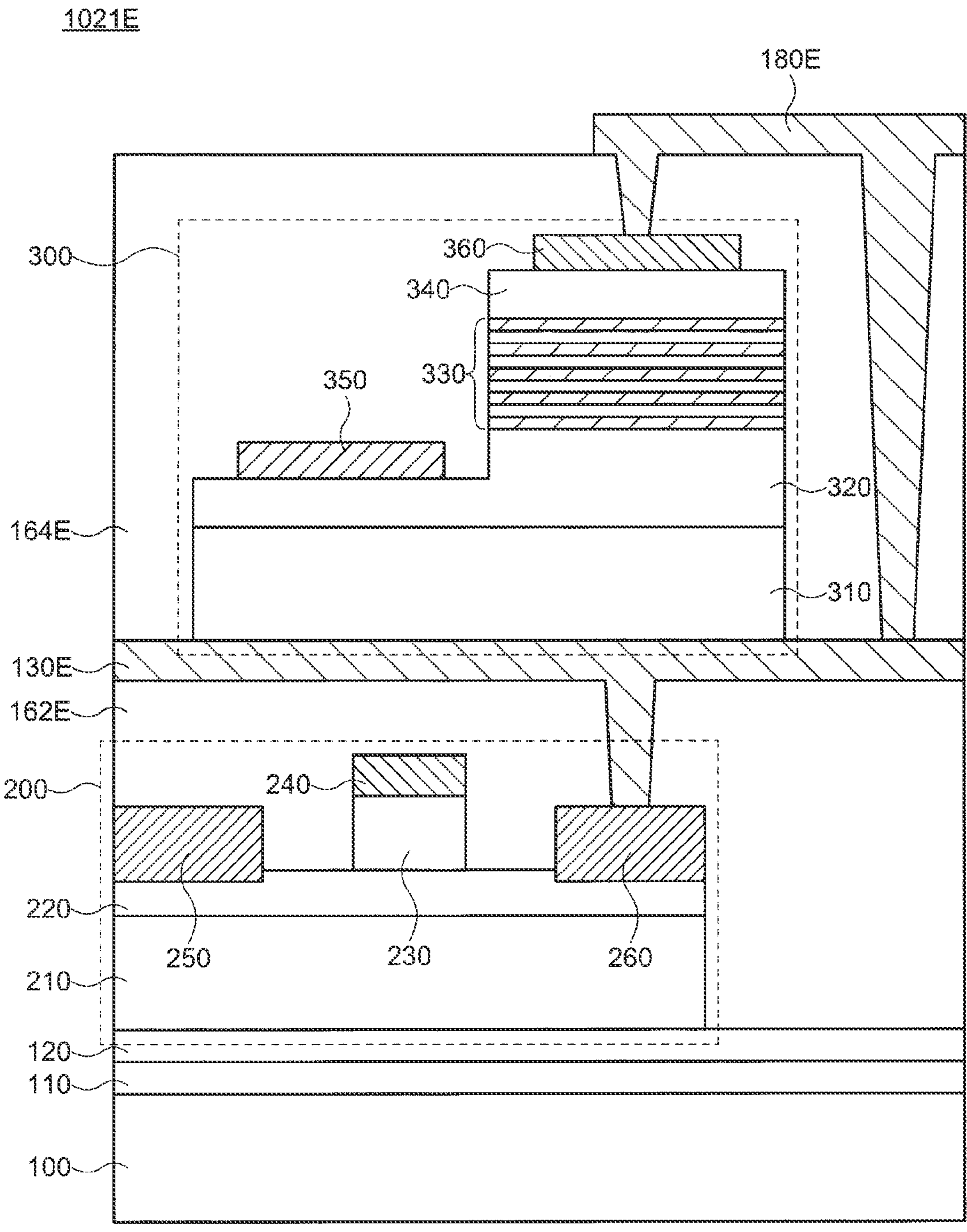
FIG. 13 is a cross-sectional view of a pixel of a display device according to an embodiment of the present invention.

FIG. 13 is a cross-sectional view of a pixel 1021E of the display device according to an embodiment of the present invention. As shown in FIG. 13, the display device 10E includes the substrate 100 such as the amorphous glass substrate, the base layer 110, the first buffer layer 120, the transistor 200, a first interlayer film 162E, a second buffer layer 130E, the light emitting diode 300, a second interlayer film 164E, and a transparent conductive layer 180E. The transistor 200 is provided over the first buffer layer 120 and the light emitting diode 300 is provided over the second buffer layer 130E. The second buffer layer 130E is provided over the first buffer layer 120. That is, the light emitting diode 300 is provided over the transistor 200 in the display device 10E.

The first interlayer film 162E is provided on the first buffer layer 120 so as to cover the transistor 200. The first interlayer film 162E can planarize unevenness of the transistor 200. The second interlayer film 164E is provided on the second buffer layer 130E so as to cover the light emitting diode 300. The second interlayer film 164E can planarize unevenness of the light emitting diode 300. The same organic insulating film as the interlayer film 160 can be used as the first interlayer film 162E and the second interlayer film 164E.

The second buffer layer 130E overlaps the transistor 200 and is provided over the first interlayer film 162E having an opening. Further, the second buffer layer 130E is electrically connected to the drain electrode 260 through the opening of the first interlayer film 162E. That is, the second buffer layer 130E has conductivity. Thus, a conductive film such as a titanium (Ti) film or a titanium nitride ($TiN_x$) film can be used as the second buffer layer 130E. In addition, the second buffer layer 130E may be a single film or a laminated film. When the second buffer layer 130E is the laminated film, the titanium film or the titanium nitride film that has a c-axis orientation and improves the crystallinity of the second gallium nitride layer 310 may be provided on the surface of the second buffer layer 130E, and a metal film such as aluminum (Al) can be provided under a conductive film such as the titanium film or the titanium nitride film. Further, the conductive film such as the titanium film or the titanium nitride film can block or reflect light emitted from the light emitting diode 300. Therefore, it is not necessary to provide a separate light shielding layer between the transistor 200 and the light emitting diode 300.

The transparent conductive layer 180E is electrically connected to the second buffer layer 130E through an opening provided in the second interlayer film 164E. Since the second buffer layer 130E has conductivity as described above, the transparent conductive layer 180E is electrically connected to the drain electrode 260 and the p-type electrode 360 through the second buffer layer 130E. Light emitted from the light emitting layer 330 of the light emitting diode 300 is transmitted through the transparent conductive layer 180 and emitted to the outside. The same transparent conductive film as the transparent conductive layer 180 can be used as the transparent conductive layer 180E.

In addition, when the light emitting diode 300 is provided with a protective film, the transparent conductive layer 180E may be electrically connected to the second buffer layer 130E and the p-type electrode 360 without passing through the opening of the second interlayer film 164E.

In this embodiment, it is possible to provide the display device 10E including the transistor 200 and the light emitting diode 300 using the gallium nitride layers formed over the amorphous glass substrate. Further, the second buffer layer 130E can function as the conductive layer that electrically connects the transistor 200 and the light emitting diode 300 to each other. Furthermore, the second buffer layer 130E can also function as the light shielding layer or the reflective layer. Therefore, the second buffer layer 130E can prevent the light emitted from the light emitting diode 300 from entering the transistor 200, and reflect the light emitted from the light emitting diode 300 to improve the light extraction efficiency to the outside.

Modification 5

A display device 10F according to an embodiment of the present invention is described with reference to FIG. 14. In addition, when a configuration of the display device 10F is the same as the configuration of the display device 10 or the configuration of the display device 10E, the description of the configuration of the display device 10F may be omitted.

Figure 14:
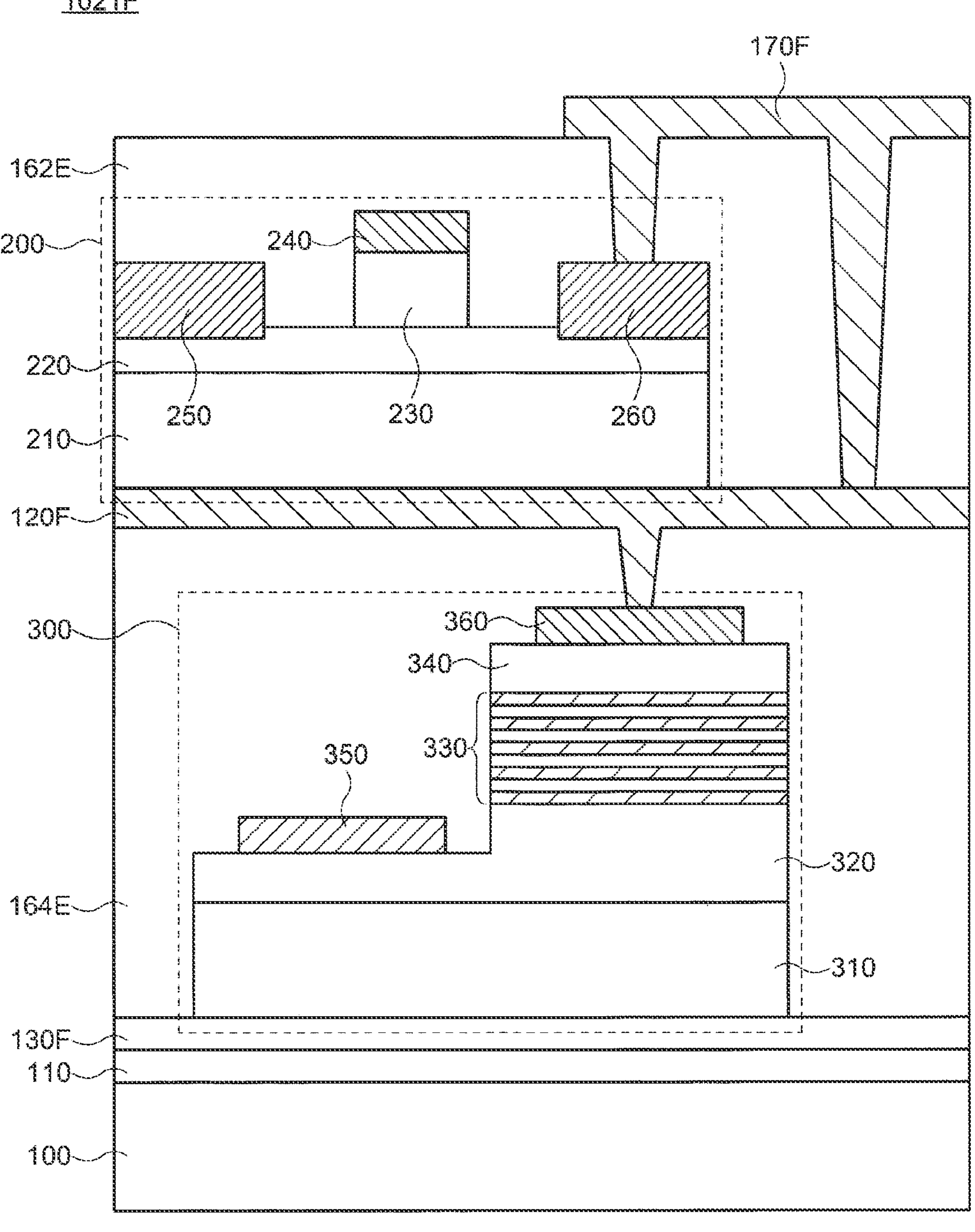
FIG. 14 is a cross-sectional view of a pixel of a display device according to an embodiment of the present invention.

FIG. 14 is a cross-sectional view of a pixel 1021F of the display device 10F according to an embodiment of the present invention. As shown in FIG. 14, the display device 10F includes the substrate 100 such as the amorphous glass substrate, the base layer 110, a second buffer layer 130F, the light emitting diode 300, a second interlayer film 164E, and a first buffer layer 120F, the transistor 200, a first interlayer film 162E, and a conductive layer 170F. The light emitting diode 300 is provided over the second buffer layer 130F and the transistor 200 is provided over the first buffer layer 120F. The first buffer layer 120F is provided over the second buffer layer 130F. That is, the transistor 200 is provided over the light emitting diode 300 in the display device 10F.

Light emitted from the light emitting layer 330 of the light emitting diode 300 is transmitted through the second buffer layer 130F and emitted to the outside. That is, the second buffer layer 130F has translucency. Therefore, for example, a transparent film such as an aluminum nitride (AlN) film can be used as the second buffer layer 130F.

The first buffer layer 120F overlaps the light emitting diode 300 and is provided over the second interlayer film 164E having an opening. Further, the first buffer layer 120F is electrically connected to the p-type electrode 360 through the opening of the second interlayer film 164E. That is, the first buffer layer 120F has conductivity. Thus, for example, a conductive film such as a titanium (Ti) film or a titanium nitride ($TiN_x$) film can be used as the first buffer layer 120F. In addition, the first buffer layer 120E may be a single film or a laminated film. When the first buffer layer 120E is the laminated film, the titanium film or the titanium nitride film that has a c-axis orientation and improves the crystallinity of the first gallium nitride layer 210 may be provided on the surface of the first buffer layer 120E, and a metal film such as aluminum (Al) can be provided under a conductive film such as the titanium film or the titanium nitride film. Further, the conductive film such as the titanium film or the titanium nitride film can shield or reflect light emitted from the light emitting diode 300. Therefore, it is not necessary to provide a separate light shielding layer between the light emitting diode 300 and the transistor 200.

The conductive layer 170F is provided so as to be electrically connected to the first buffer layer 120F and the drain electrode 260 through an opening provided in the first interlayer film 162E.

In addition, when the transistor 200 is provided with a protective film, the transparent conductive layer 170F may be electrically connected to the first buffer layer 120F and the drain electrode 260 without passing through the opening of the first interlayer film 162E.

In this embodiment, it is possible to provide the display device 10F including the transistor 200 and the light emitting diode 300 using the gallium nitride layers formed over the amorphous glass substrate. Further, the first buffer layer 120F can function as the conductive layer that electrically connects the light emitting diode 300 and the transistor 200 to each other. Furthermore, the first buffer layer 120F can also function as the light shielding layer or the reflective layer. Therefore, the first buffer layer 120F can prevent the light emitted from the light emitting diode 300 from entering the transistor 200, and reflect the light emitted from the light emitting diode 300 to improve the light extraction efficiency to the outside.

Third Embodiment

A display device 10G according to an embodiment of the present invention is described with reference to FIGS. 15, 16, and 17A to 17C. In addition, when a configuration of the display device 10G is the same as the configuration of the display device 10, the description of the configuration of the display device 10G may be omitted.

Figure 15:
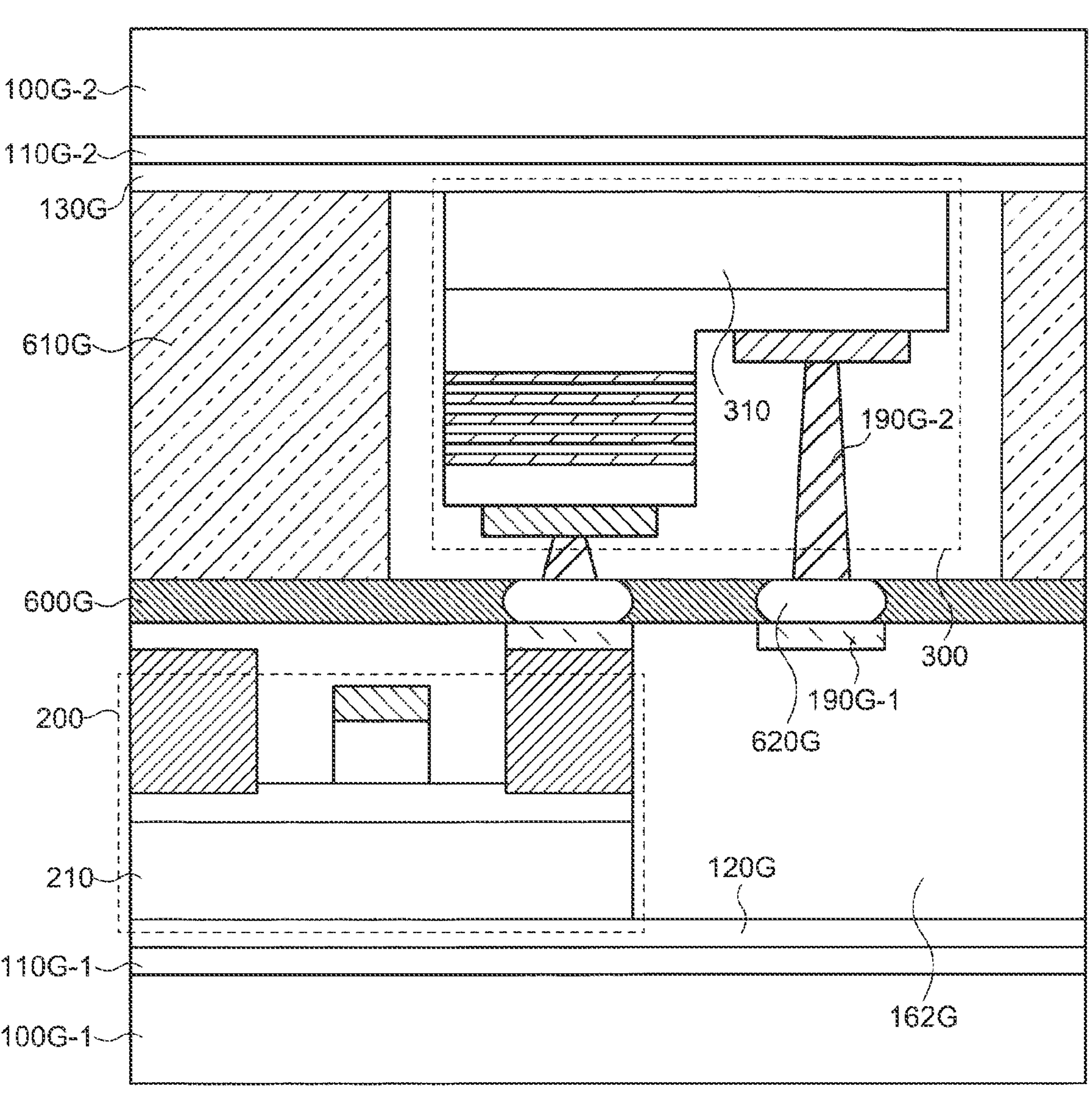
FIG. 15 is a cross-sectional view of a pixel of a display device according to an embodiment of the present invention.

FIG. 15 is a cross-sectional view of a pixel 1021G of the display device 10G according to an embodiment of the present invention. As shown in FIG. 15, the display device 10G includes a first substrate 100G-1 such as an amorphous glass substrate, a first base layer 110G-1, a first buffer layer 120G, the transistor 200, a first interlayer film 162G, a first connecting conductive layer 190G-1, a second substrate 100G-2 such as an amorphous glass substrate, a second base layer 110G-2, a second buffer layer 130G, the light emitting diode 300, a second connecting conductive layer 190G-2, a light shielding layer 600G, an adhesive resin member 610G, and a conductive connecting member 620G.

The display device 10G is manufactured so that the transistor 200 formed over the first substrate 100G-1 and the light emitting diode 300 formed over the second substrate 100G-2 are electrically connected to each other via the conductive connection member 620G and are attached. Therefore, the configuration of the display device 10G is described below while describing the method for manufacturing the display device 10G with reference to FIGS. 16 and 17A to 17C.

Figure 16:
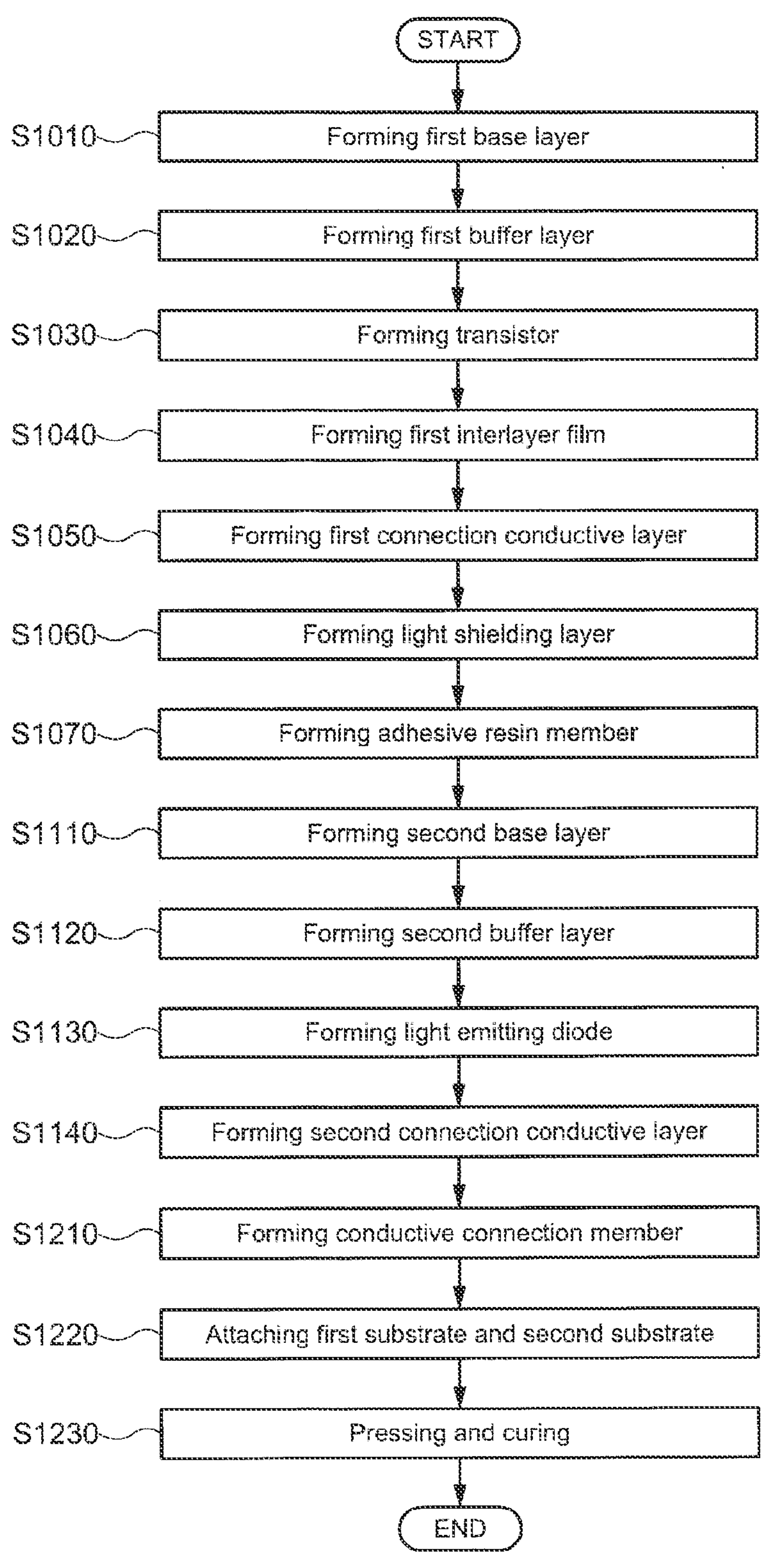
FIG. 16 is a flow chart showing a method for manufacturing a display device according to an embodiment of the present invention.
Figure 17A:
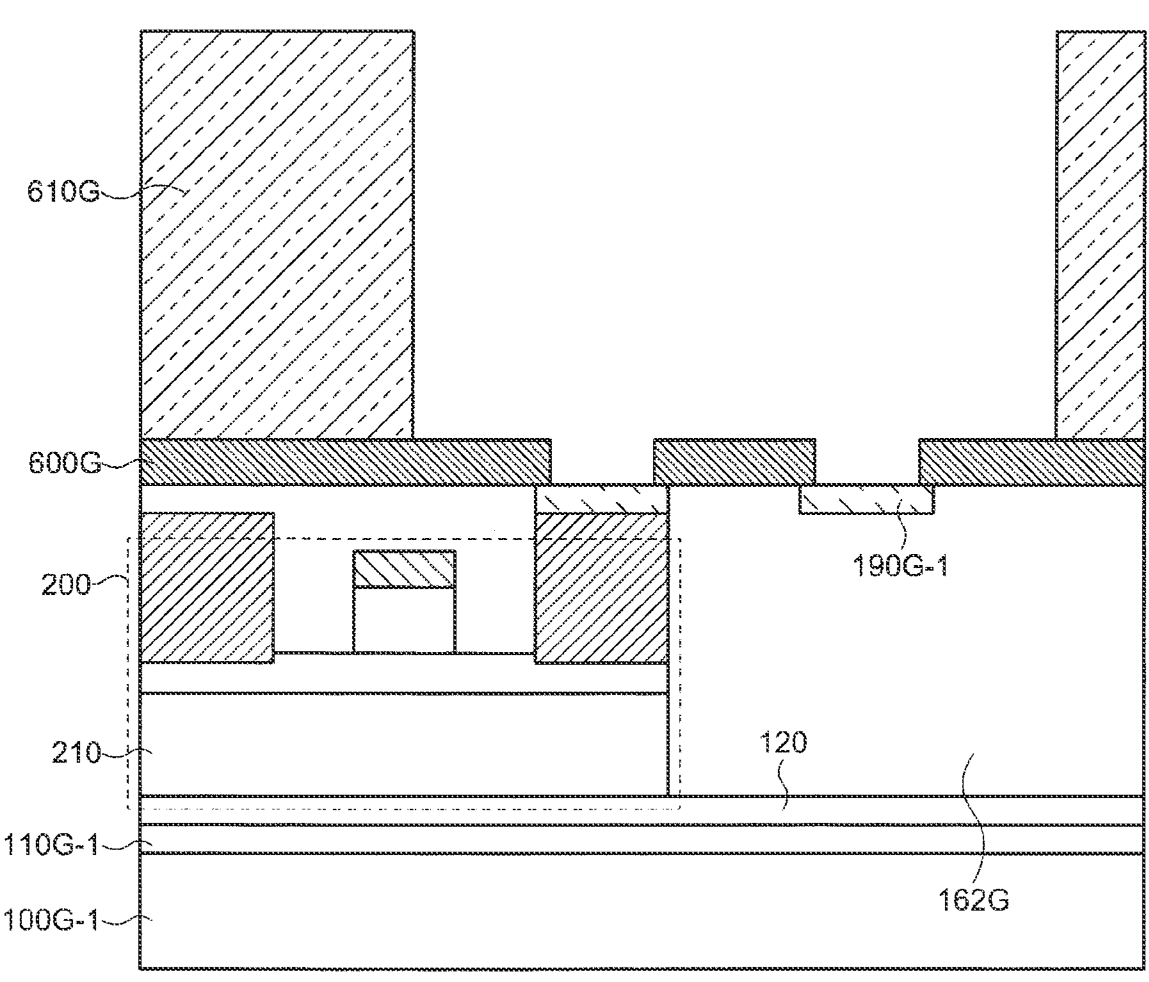
FIG. 17A is a cross-sectional view showing a method for manufacturing a display device according to an embodiment of the present invention.
Figure 17B:
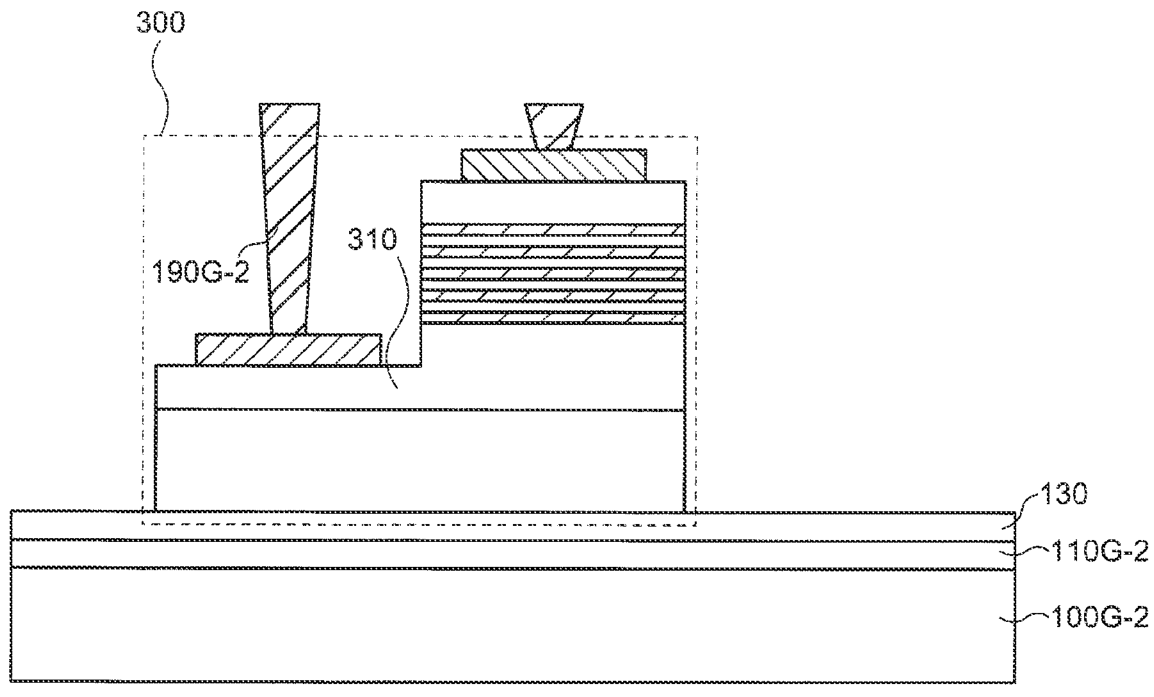
FIG. 17B is a cross-sectional view showing a method for manufacturing a display device according to an embodiment of the present invention.
Figure 17C:
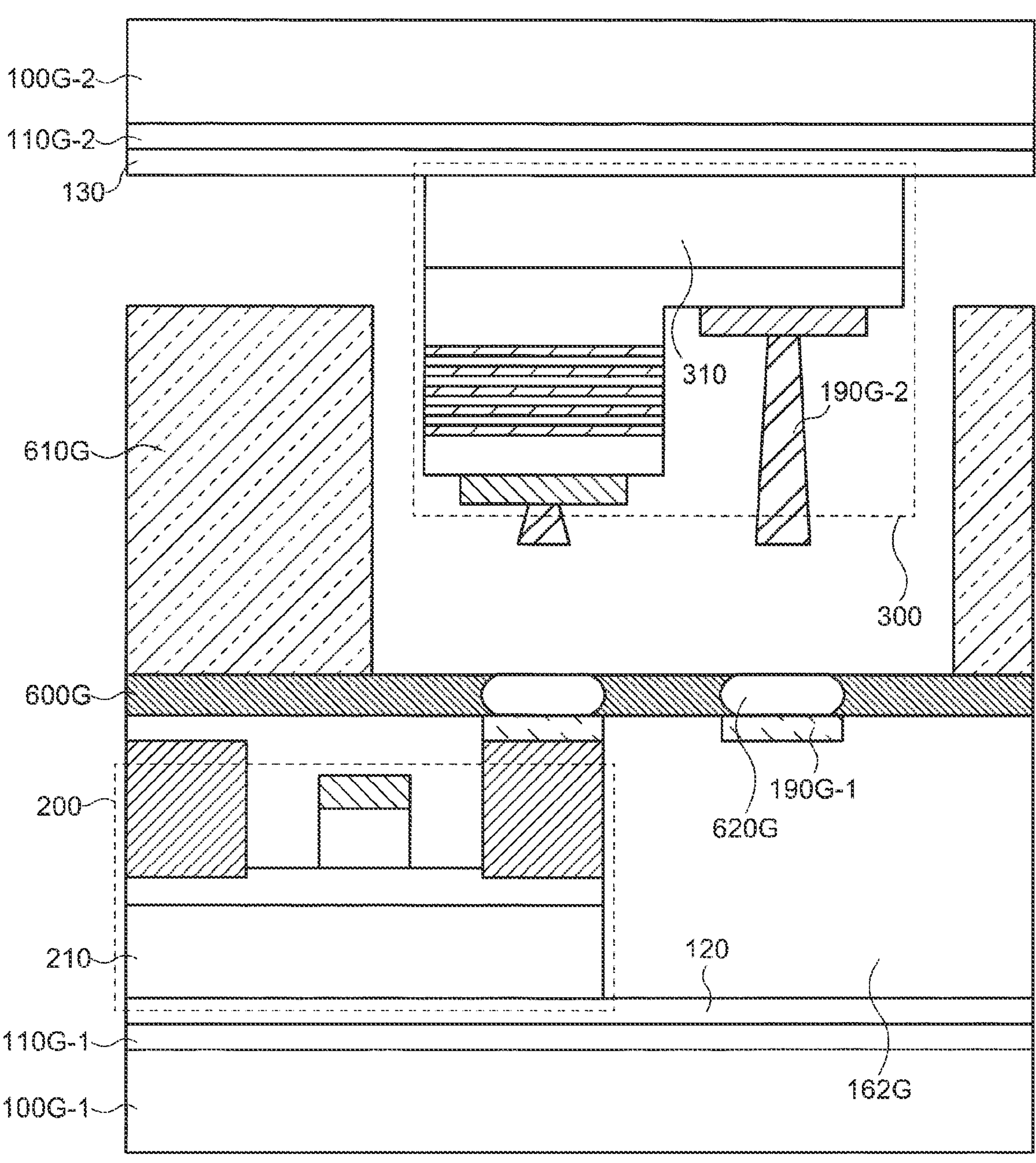
FIG. 17C is a cross-sectional view showing a method for manufacturing a display device according to an embodiment of the present invention.

FIG. 16 is a flow chart showing the method for manufacturing the display device 10G according to an embodiment of the present invention. FIGS. 17A to 17C are cross-sectional views showing the method for manufacturing the display device 10G according to an embodiment of the present invention.

Steps S1010 to S1070 shown in FIG. 16 are steps using the first substrate 100G-1 such as the amorphous glass substrate as a support substrate.

In step S1010, the first base layer 110G-1 is formed on the first substrate 100G-1. The first base layer 110G-1 can use the same insulating film as the base layer 110 described above. Further, the first base layer 110G-1 can be formed using sputtering or CVD.

In step S1020, the first buffer layer 120G is formed on the first base layer 110G-1. The first buffer layer 120G can use the same conductive film or transparent film as the first buffer layer 120 described above. Further, the first buffer layer 120G can be formed using sputtering or CVD.

In step S1030, the transistor 200 is formed over the first buffer layer 120G.

In step S1040, the first interlayer film 162G is formed to cover the transistor 200. The first interlayer film 162G can use the same organic insulating film as the interlayer film 160 described above. Further, an opening is formed in the first interlayer film 162G using photolithography, if necessary.

In step S1050, the first connection conductive layer 190G-1 electrically connected to the drain electrode 260 of the transistor 200 through the opening of the first interlayer film 162G is formed. For example, a laminated metal film of aluminum and titanium (Al/Ti film) can be used as the first connection conductive layer 190G-1.

In step S1060, the light shielding layer 600G is formed such that a portion of the surface of the first connection conductive layer 190G-1 is exposed. Although a black matrix or a resin black can be used for the light shielding layer 600G, for example, the material of the light shielding layer is limited thereto. The light shielding layer 600G may be any material as long as the light shielding layer 600G has insulating properties and does not transmit light.

In step S1070, an adhesive resin member 610G is formed on the light shielding layer 600G (see FIG. 17A). The adhesive resin member 610G is formed at least partially around the light emitting diode 300. For example, an acrylic resin or the like can be used for the adhesive resin member 610G.

Steps S1110 to S1140 shown in FIG. 16 are steps using the second substrate 100G-2 such as the amorphous glass substrate as a support substrate.

In step S1110, the second base layer 110G-2 is formed on the second substrate 100G-2. The second base layer 110G-2 can use the same insulating film as the base layer 110 described above. Further, the second base layer 110G-2 can be formed using sputtering or CVD.

In step S1120, the second buffer layer 130G is formed on the second base layer 110G-2. Light emitted from the light emitting layer 330 of the light emitting diode 300 is transmitted through the second buffer layer 130G and emitted to the outside. Thus, the second buffer layer 130G has translucency. For example, a translucent film such as an aluminum nitride (AlN) film can be used as the second buffer layer 130G. Further, the second buffer layer 130G can be formed using sputtering or CVD.

In step S1130, the light emitting diode 300 is formed on the second buffer layer 130G.

In step S1140, the second connection conductive layer 190G-2 is formed so as to be electrically connected to the n-type electrode 350 or the p-type electrode 360 of the light emitting diode 300 (see FIG. 17B). For example, a laminated metal film of aluminum and titanium (Al/Ti film) can be used as the second connection conductive layer 190G-2.

Steps S1210 to S1230 are steps for electrically connecting the transistor 200 over the first substrate 100G-1 and the light emitting diode over the second substrate 100G-2 to each other.

In step S1210, the conductive connection member 620G is formed on the first connection conductive layer 190G-1 formed over the first substrate 100G-1 or the second connection conductive layer 190G-2 formed over the second substrate 100G-2. For example, solder or an anisotropic conductive film (ACF) can be used as the conductive connection member 620G.

In step S1220, the first substrate 100G-1 and the second substrate 100G-2 are attached to each other (see FIG. 17C). At this time, since the adhesive resin member 610G functions as a spacer, the gap between the first substrate 100G-1 and the second substrate 100G-2 is maintained to be constant. Further, the adhesive resin member 610G can bond the first substrate 100G-1 and the second substrate 100G-2 to each other.

In step S1230, the first substrate 100G-1 and the second substrate 100G-2 are pressed together, and the conductive connection member 620G is cured. In addition, the curing of the conductive connection member 620G may be performed in stages of temporary curing and main curing.

By the manufacturing method described above, the transistor 200 over the first substrate 100G-1 and the light emitting diode on 100G-2 over the second substrate are electrically connected via the conductive connection member 620G, and the display device 10G shown in FIG. 15 can be manufactured. In addition, the method for manufacturing the display device 10G is not limited thereto. For example, the adhesive resin member 610G can be formed over the second substrate 100G-2 instead of the first substrate 100G-1.

In this embodiment, the transistor 200 is formed using the first gallium nitride layer 210 formed over the first substrate 100G-1, and the light emitting diode 300 is formed using the second gallium nitride layer 210 formed over the second substrate 100G-2. Since the first gallium nitride layer 210 and the second gallium nitride layer 310 are formed on the first buffer layer 120G and the second buffer layer 130G, respectively, the first gallium nitride layer 210 and the second gallium nitride layer 310 have proper crystallinity. Further, it is possible to provide the display device 10G including the transistor 200 and the light emitting diode 300 using the gallium nitride layers formed over the amorphous glass substrates by bonding the first substrate 100G-1 and the second substrate 100G-2 together.

Modification 6

A display device 10H, which is a modification of the display device 10G, is described with reference to FIGS. 18A and 18B. In addition, when a configuration of the display device 10H is the same as the configuration of the display device the description of the configuration of the display device 10H may be omitted.

Figure 18A:
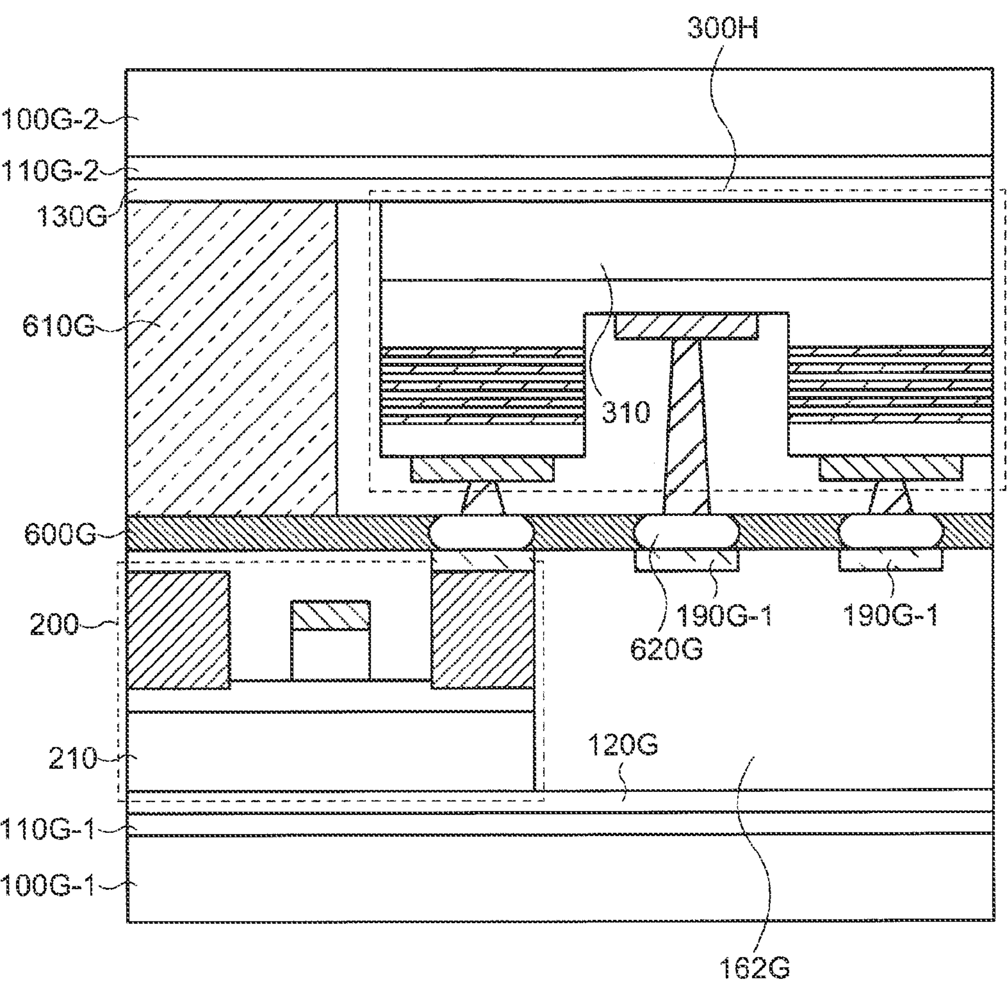
FIG. 18A is a cross-sectional view of a pixel of a display device according to an embodiment of the present invention.

FIG. 18A is a cross-sectional view of a pixel 1021H of the display device according to an embodiment of the present invention. Further, FIG. 18B is a plan view of a light emitting diode 300H of the display device 10H according to an embodiment of the present invention. Specifically, FIG. 18B is a plan view showing an n-type electrode 350H and a p-type electrode 360H of the light emitting diode 300H.

Figure 18B:
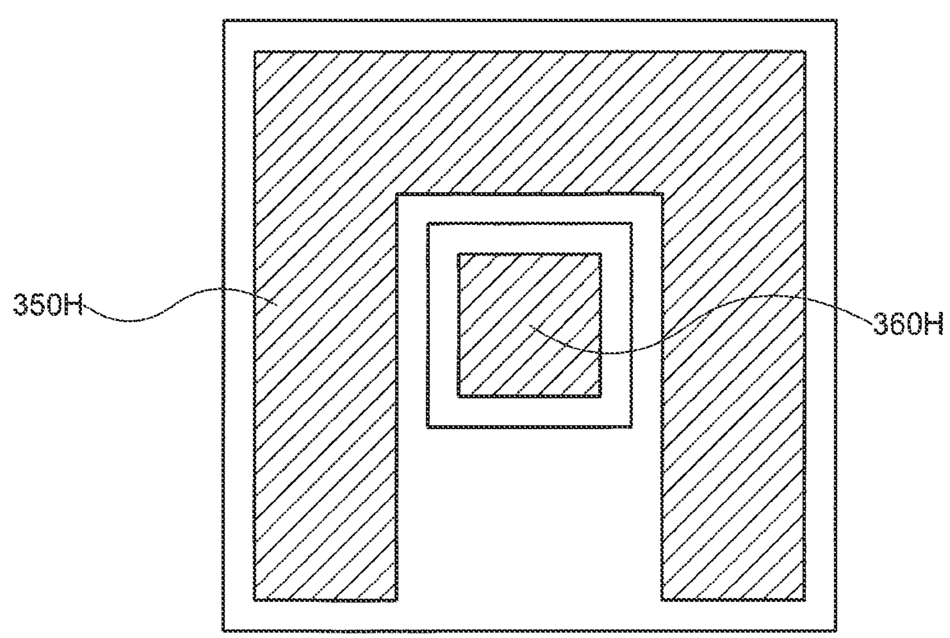
FIG. 18B is a plan view of a light emitting diode of a display device according to an embodiment of the present invention.

As shown in FIG. 18B, in the display device 10H, the p-type electrode 360H is surrounded by the n-type electrode 350H in a U shape. Thus, a large amount of current flows through the light emitting diode 300H, so that the brightness of the light emitting diode 300H is high. Further, since the area of the p-type electrode 360H is large, the margin of electrical connection between the p-type electrode 360 of the light emitting diode 300H and the drain electrode 260 of the transistor 200 can be secured in the process of bonding the first substrate 100G-1 and the second substrate 100G-2.

Since the light-emitting diode 300H according to this modification also includes the second gallium nitride layer 310 provided on the second buffer layer 130, the light emitting diode 300H can be formed on the amorphous glass substrate.

Fourth Embodiment

A display device 10I according to an embodiment of the present invention is described with reference to FIGS. 19A and 19B. In addition, when a configuration of the display device 10I is the same as the configuration of the display device 10, the description of the configuration of the display device 10I may be omitted.

Figure 19A:
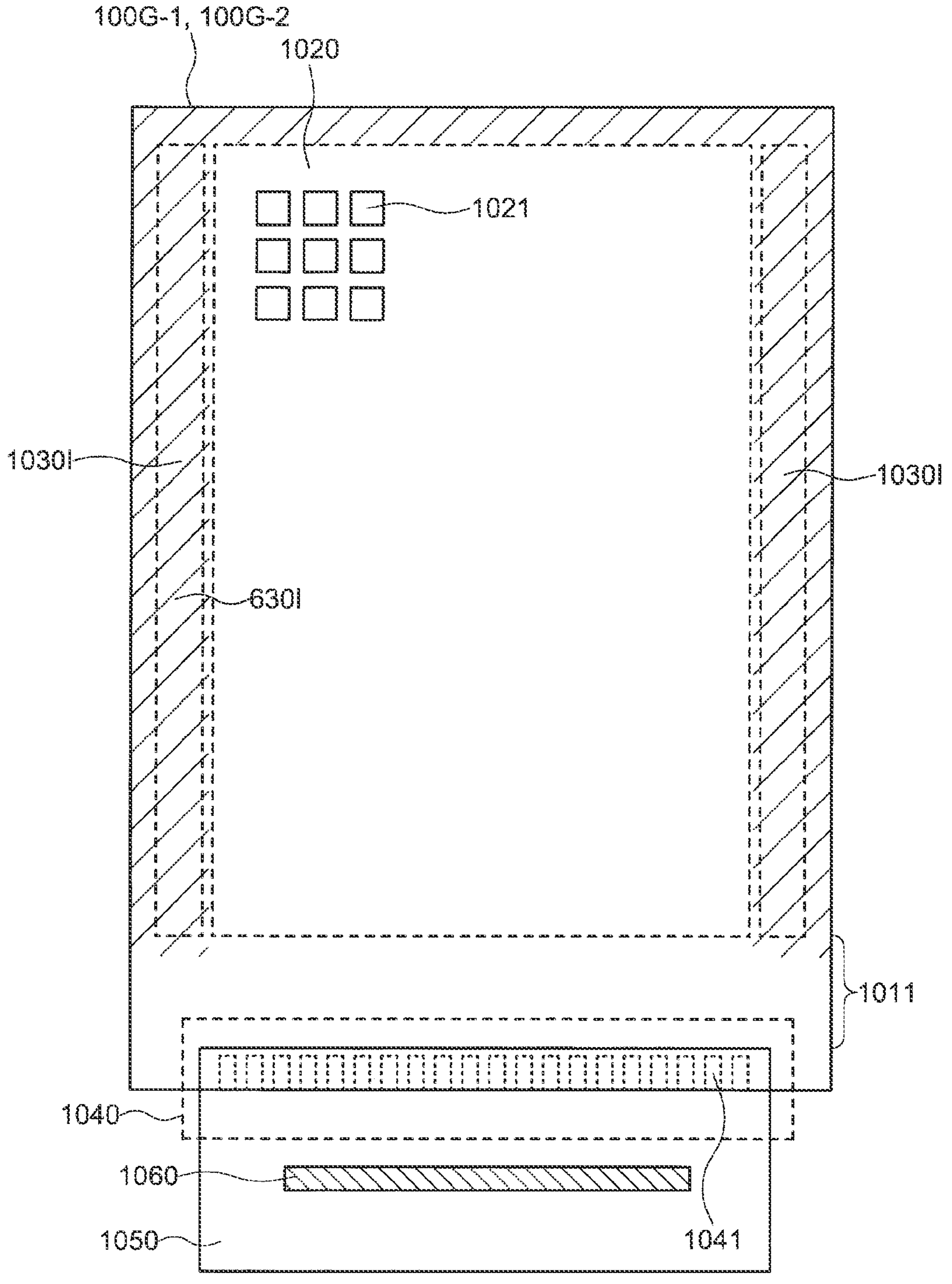
FIG. 19A is a schematic diagram showing a configuration of a display device according to an embodiment of the present invention.

FIG. 19A is a schematic diagram showing the configuration of the display device 10I according to an embodiment of the present invention. Further, FIG. 19B is a cross-sectional view of the drive circuit portion 1030I of the display device 10I according to an embodiment of the present invention.

As shown in FIG. 19A, in the display device 10I, a sealing material 630I is provided around the display portion 1020. That is, the sealing member 630I is provided in the driving circuit portion 1030I. More specifically, the sealing member 630I is provided between the first substrate 100G-1 and the second substrate 100G-2. The sealing member 630I may overlap the transistor 200 included in the driver circuit portion 1030I. In the display device 10I, the first substrate 100G-1 and the second substrate 100G-2 are fixed by the sealing member 630I.

Figure 19B:
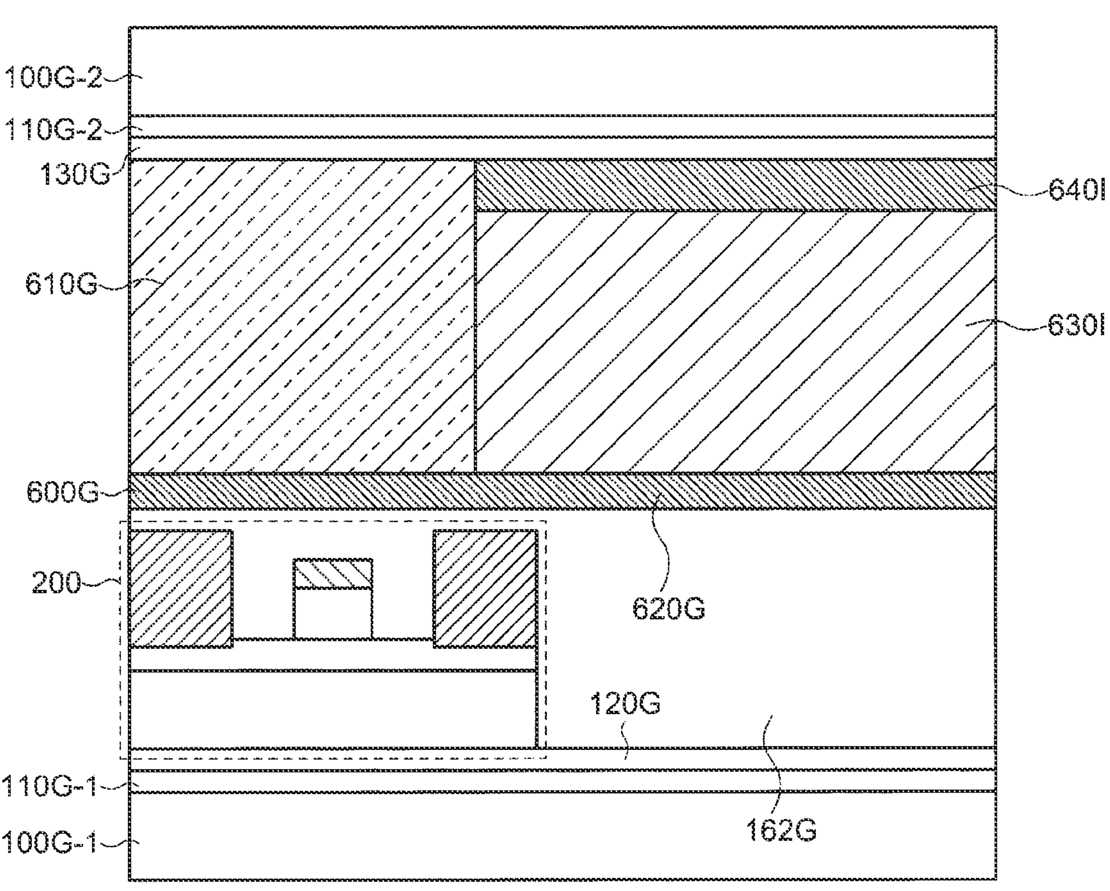
FIG. 19B is a cross-sectional view of a driving circuit portion of a display device according to an embodiment of the present invention.

As shown in FIG. 19B, the sealing member 630I is provided on the side of the second substrate 100G-2. Further, a light shielding layer 640I may be provided so as to overlap the sealing member 630I. The light shielding layer 640I can use the same material as the light shielding layer 600G. By providing the light shielding layer 640I, it is possible to shield the light incident from the side surface of the display device 10I. Since light can be prevented from entering the transistor 200, normally-off characteristics of the transistor 200 are maintained and reliability of the transistor 200 is improved.

In the display device 10I according to the present embodiment, the first substrate 100G-1 and the second substrate 100G-2 can be attached and fixed using the sealing member 630I. Thus, the durability of the display device 10I is improved. Further, by providing the light shielding layer 640 in the peripheral portion of the display device 10I so as to overlap the sealing member 630I, light incident from the side surface of the display device 10I can be shielded. As a result, the drive circuit portion 1030I can be provided close to the side surface of the display device 10I, so that the frame of the display device 10I can be narrowed.

Modification 7

A display device 10J, which is a modification of the display device 10I, is described with reference to FIGS. 20 and 21A to 21C. In addition, when a configuration of the display device 10J is the same as the configuration of the display device 10I, the description of the configuration of the display device 10J may be omitted.

Figure 20:
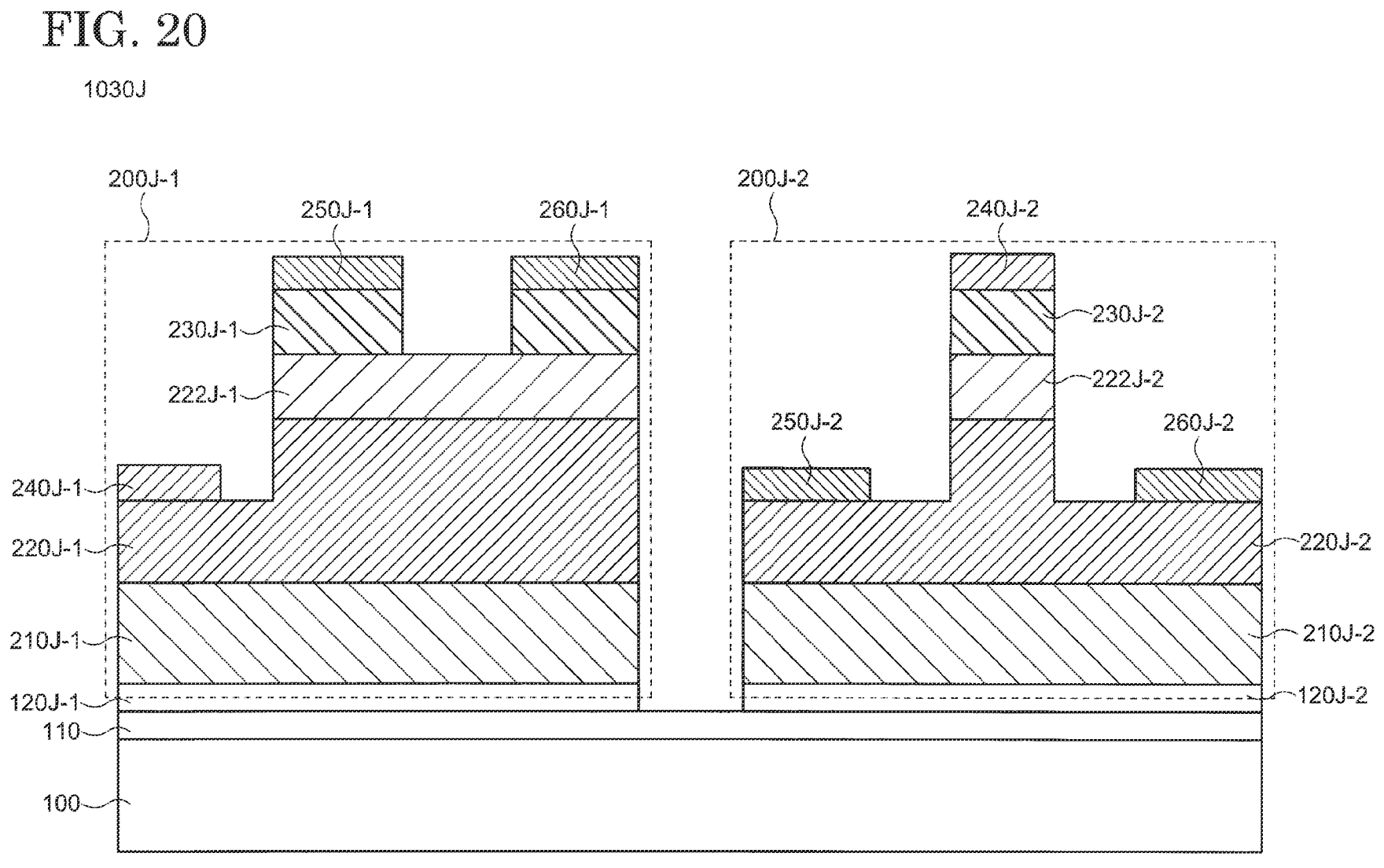

FIG. 20 is a cross-sectional view of a drive circuit portion 1030J of the display device 10J according to an embodiment of the present invention. As shown in FIG. 20, the drive circuit portion 1030J includes a first transistor 200J-1 and a second transistor 200J-2. The first transistor 200J-1 is provided over a first buffer layer 120J-1 and includes a first gallium nitride layer 210J-1, a first aluminum gallium nitride layer 220J-1, a first cap layer 222J-1, a first p-type gallium nitride layer 230J-1, a first gate electrode 240J-1, a first source electrode 250J-1, and a first drain electrode 260J-1. Further, the second transistor 200J-2 is provided over the second buffer layer 120J-2 and includes a second gallium nitride layer 210J-2, a second aluminum gallium nitride layer 220J-2, a second cap layer 222J-2, a second p-type gallium nitride layer 230J-2, a second gate electrode 240J-2, a second source electrode 250J-2, and a second drain electrode 260J-2.

In the first transistor 200J-1, the first aluminum gallium nitride layer 220J-1 is provided on the first gallium nitride layer 210J-1. The first gate electrode 240J-1 is provided on the first aluminum gallium nitride layer 220J-1. The first cap layer 222J-1 and the first p-type gallium nitride layer 230J-1 are sequentially provided on the first aluminum gallium nitride layer 220J-1. The first source electrode 250J-1 and the first drain electrode 260J-1 are provided on the first p-type gallium nitride layer 230J-1. The first transistor 200J-1 is a so-called p-channel transistor.

In the second transistor 200J-2, the second aluminum gallium nitride layer 220J-2 is provided on the second gallium nitride layer 210J-2. The second source electrode 250J-2 and the second drain electrode 260J-2 are provided on the second aluminum gallium nitride layer 220J-2. The second cap layer 222J-2 and the second p-type gallium nitride layer 230J-2 are sequentially provided on the second aluminum gallium nitride layer 220J-2. The second gate electrode 240J-2 is provided on the second p-type gallium nitride layer 230J-2. The second transistor 200J-2 is a so-called n-channel transistor.

The drive circuit portion 1030J may include a CMOS using the first transistor 200J-1 and the second transistor 200J-2.

Figure 21A:
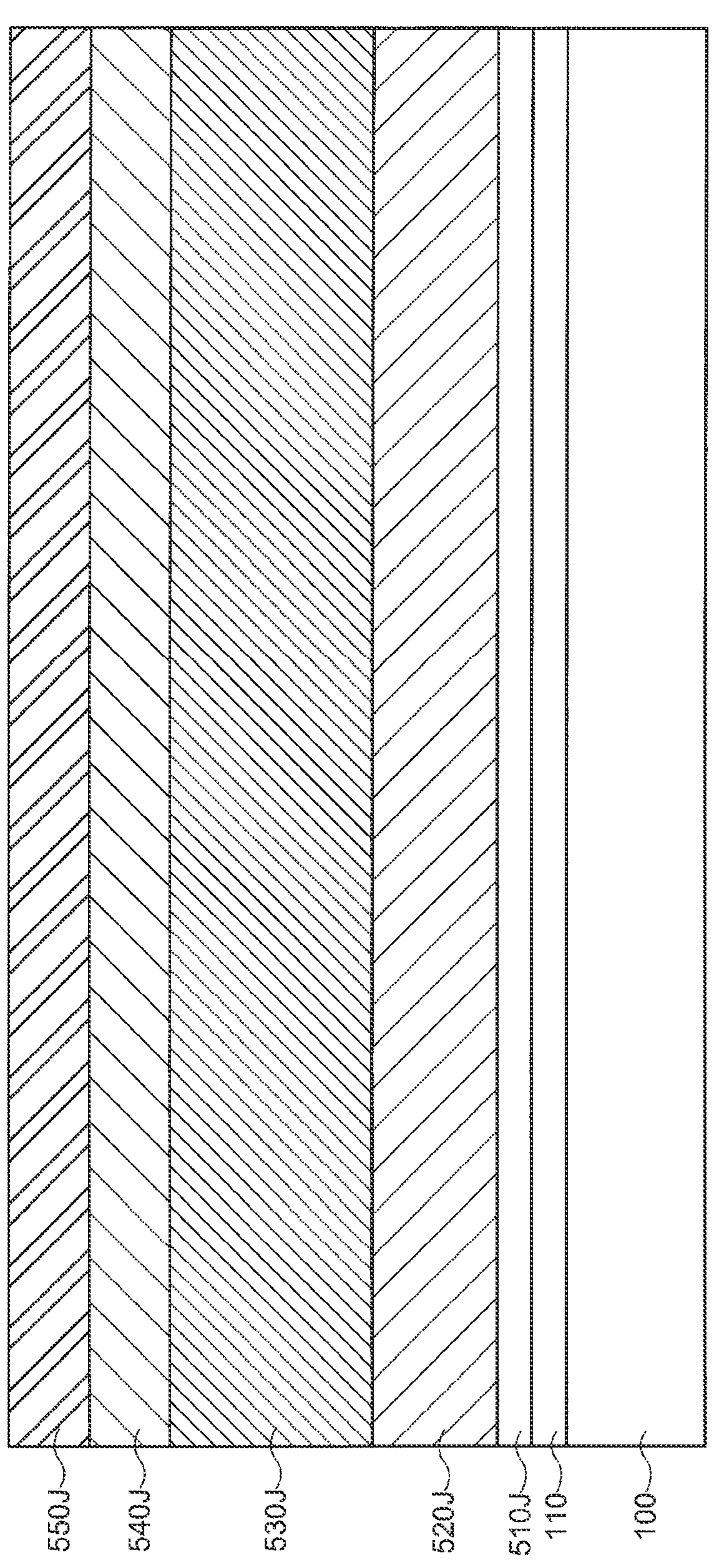
FIG. 21A is a cross-sectional view showing a method for manufacturing a first transistor and a second transistor included in a drive circuit portion of a display device according to an embodiment of the present invention.
Figure 21B:
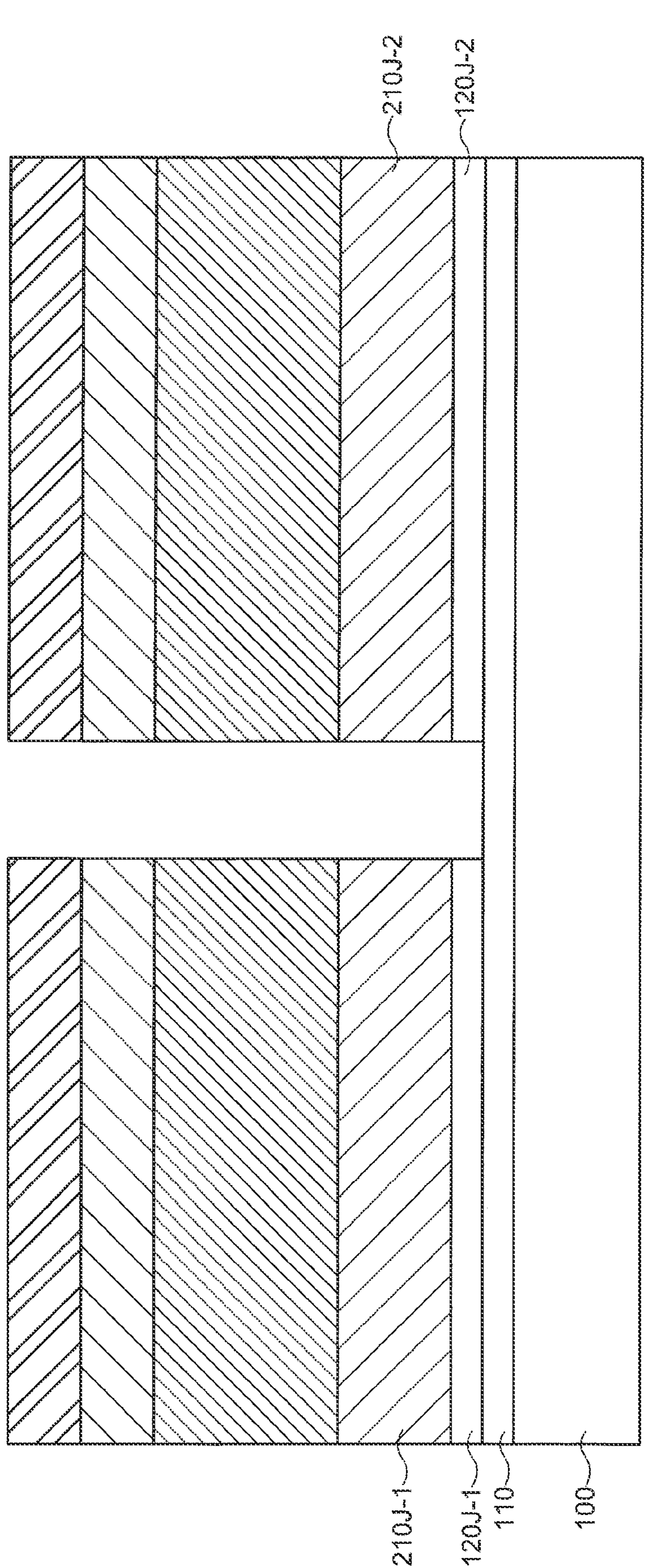
FIG. 21B is a cross-sectional view showing a method for manufacturing a first transistor and a second transistor included in a drive circuit portion of a display device according to an embodiment of the present invention.
Figure 21C:
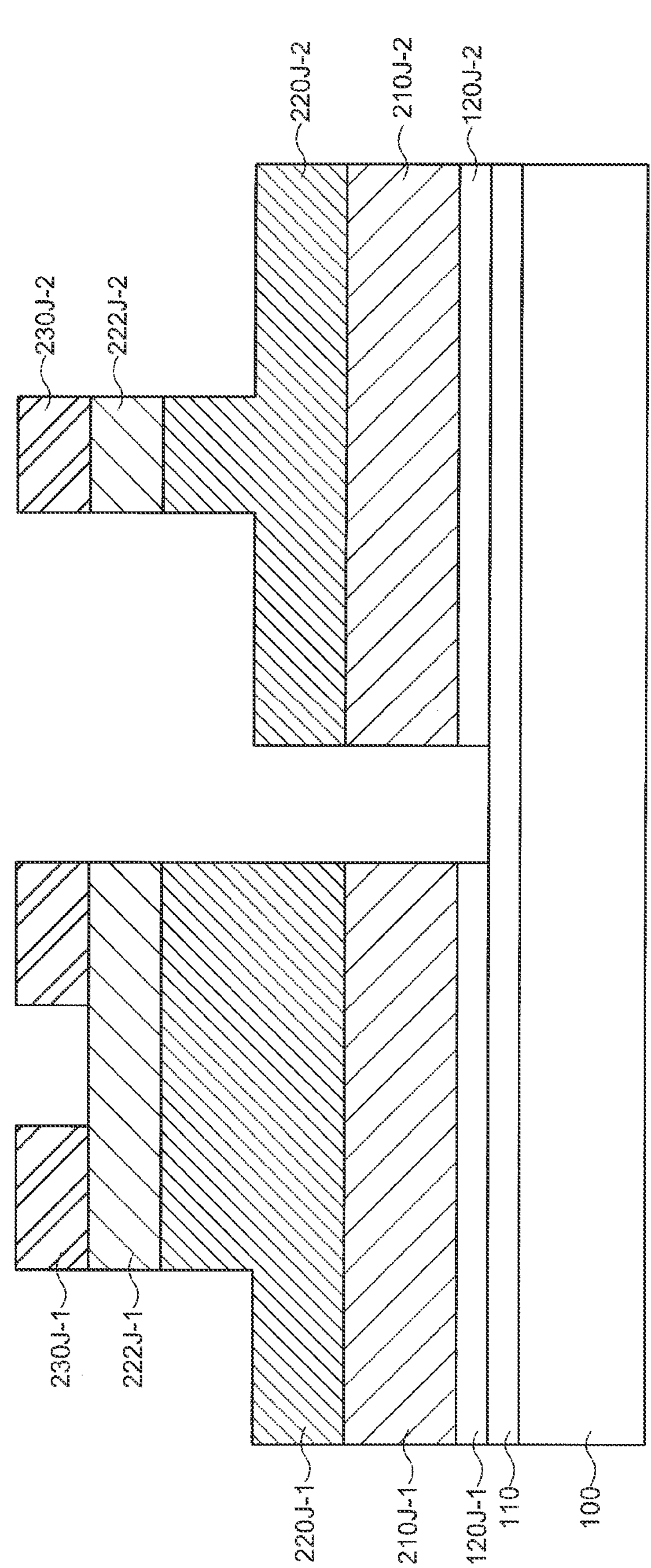
FIG. 21C is a cross-sectional view showing a method for manufacturing a first transistor and a second transistor included in a driver circuit portion of a display device according to an embodiment of the present invention.

FIG. 21A to 21C are cross-sectional views showing a method for manufacturing the first transistor 200J-1 and the second transistor 200J-2 included in the drive circuit portion 1030J of the display device 10J according to an embodiment of the present invention.

First, the base layer 110, a buffer film 510J, a gallium nitride film 520J, an aluminum gallium nitride film 530J, a gallium nitride film 540J, and a gallium nitride film doped with magnesium 550J are sequentially formed over the substrate 100 such as the amorphous glass substrate. These films can be deposited using sputtering (see FIG. 21A).

Next, two regions are separated using photolithography (see FIG. 21B). At this time, the first buffer layer 120J-1, the first gallium nitride layer 210J-1, the second buffer layer 120J-2, and the second gallium nitride layer 210J-2 are formed.

Next, the first aluminum gallium nitride layer 220J-1, the first cap layer 222J-1, the first p-type gallium nitride layer 230J-1, the second aluminum gallium nitride layer 220J-2, the second cap layer 222J-2, and the second p-type gallium nitride layer 230J-2 are formed using photolithography (see FIG. 21C).

Next, a metal film such as titanium or aluminum is deposited, and then photolithography is used to form the first source electrode 250J-1, the first drain electrode 260J-1, the second source electrode 250J-2, the second source electrode 250J-2, and the drain electrode 260J-2. Further, a metal film such as nickel or gold is deposited, and then photolithography is used to form the first gate electrode 240J-1 and the second gate electrode 240J-2. Thus, the first transistor 200J-1 and the second transistor 200J-2 can be formed over the substrate 100 such as the amorphous glass substrate.

In this modification, the CMOS can be formed in the driving circuit portion 1030J on the substrate 100 such as the amorphous glass substrate together with the transistor and the light emitting diode of the pixel. Therefore, a control circuit for controlling the display device 10J can be integrated in the drive circuit portion 1030J.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A display device comprising:

an amorphous glass substrate;

a first buffer layer on a first surface of the amorphous glass substrate;

a transistor comprising a first gallium nitride layer over the first buffer layer;

a second buffer layer provided in a same layer as the first buffer layer, on the first surface of the amorphous glass substrate;

a light emitting diode comprising a second gallium nitride layer provided in a same layer as the first gallium nitride layer, over the second buffer layer; and a light shielding wall between the transistor and the light emitting diode, wherein the transistor and the light emitting diode are electrically connected to each other through a transparent conductive layer, and wherein the light shielding wall is provided to separate the first buffer layer and the first gallium nitride layer from the second buffer layer and the second gallium nitride layer, below the transparent conductive layer.

2. The display device according to claim 1, further comprising a light shielding layer on a second surface opposite to the first surface of the amorphous glass substrate.

3. The display device according to claim 1, wherein the first gallium nitride layer and the second gallium nitride layer have a c-axis orientation with respect to the amorphous glass substrate.

4. The display device according to claim 1, wherein the first gallium nitride layer and the second gallium nitride layer are provided by sputtering.

5. The display device according to claim 1, wherein each of the first buffer layer and the second buffer layer comprises at least one selected from a titanium film, a titanium nitride film, and an aluminum nitride film.

6. The display device according to claim 1, wherein a length of one side of the light emitting diode is less than or equal to 100 μm.

7. A display device comprising:

a first amorphous glass substrate, a first buffer layer on the first amorphous glass substrate, a transistor comprising a first gallium nitride layer over the first buffer layer, a second amorphous glass substrate, a second buffer layer on the second amorphous glass substrate, a light emitting diode comprising a second gallium nitride layer over the second buffer layer, a light shielding layer between the transistor and the light emitting diode to separate the transistor from the light emitting diode; and a conductive connection member between the transistor and the light emitting diode to electrically connect the transistor to the light emitting diode, wherein the light emitting diode is provided to overlap the transistor.

8. The display device according to claim 7, further comprising an adhesive resin member at least partially around the light emitting diode.

9. The display device according to claim 7, further comprising a sealing member between the first amorphous glass substrate and the second amorphous glass substrate.

10. The display device according to claim 9, wherein the first amorphous glass substrate and the second amorphous glass substrate are attached to each other with the sealing member interposed therebetween.

11. The display device according to claim 7, wherein the first gallium nitride layer and the second gallium nitride layer have a c-axis orientation with respect to the first amorphous glass substrate and the second amorphous glass substrate, respectively.

12. The display device according to claim 7, wherein the first gallium nitride layer and the second gallium nitride layer are provided by sputtering.

13. The display device according to claim 7, wherein each of the first buffer layer and the second buffer layer comprises at least one selected from a titanium film, a titanium nitride film, and an aluminum nitride film.

14. The display device according to claim 7, wherein a length of one side of the light emitting diode is less than or equal to 100 μm.

* * * * *